United States Patent [19]
Anders et al.

[11] Patent Number: 6,140,773
[45] Date of Patent: Oct. 31, 2000

[54] AUTOMATED CONTROL OF LINEAR CONSTRICTED PLASMA SOURCE ARRAY

[75] Inventors: Andre Anders, Albany, Calif.; Peter A. Maschwitz, Martinsville, Va.

[73] Assignees: The Regents of the University of California, Oakland, Calif.; CRFilms Inc., Martinsville, Va.

[21] Appl. No.: 09/253,268

[22] Filed: Feb. 19, 1999

Related U.S. Application Data

[63] Continuation-in-part of application No. 08/711,844, Sep. 10, 1996.
[60] Provisional application No. 60/075,607, Feb. 19, 1998.

[51] Int. Cl.[7] ........................................ H05H 1/24
[52] U.S. Cl. ................ 315/111.21; 204/192.13; 204/192.33
[58] Field of Search .................. 315/111.21; 204/192.13, 204/192.33, 298.03, 298.32

[56] References Cited

U.S. PATENT DOCUMENTS

| | | | |
|---|---|---|---|
| 5,580,429 | 12/1996 | Chan et al. | 204/192.38 |
| 5,614,248 | 3/1997 | Schiller et al. | 204/192.16 X |
| 5,653,811 | 8/1997 | Chan | 118/723 |

OTHER PUBLICATIONS

Anders, A., et al; "Hollow–anode plasma source for molecular beam epitaxy of gallium nitride",. Rev. Sci. Instrum. 67 (3), Mar. 1996, pp. 905–907.

Anders, A., and Anders, S.; "The working principle of the hollow–anode plasma source"; Plasma Sources Sci. Technol. 4 (1995); pp. 571–575.

Miljevic, V. I.; "Some Characteristics of the hollow–anode ion source"; Rev. Sci. Instrum. 63 (4); Apr. 1992; pp. 2619–2620.

Miljevic, V. I.; "Hollow anode ion source"; Rev. Sci. Instrum. 61 (1), Jan. 1990; pp. 312–314.

Miljevic, V.; "Hollow anode ion–electron source"; Rev. Sci. Instrum. 55 (6), Jun. 1984; pp. 931–933.

Miljevic, V. I.; "Spectroscopy of hollow anode discharge"; Applied Optics, vol. 23, No. 10, May 15, 1984; pp. 1598–1600.

*Primary Examiner*—Justin P. Bettendorf
*Attorney, Agent, or Firm*—Janis Biksa; Henry P. Sartorio

[57] ABSTRACT

An apparatus and method for controlling an array of constricted glow discharge chambers are disclosed. More particularly a linear array of constricted glow plasma sources whose polarity and geometry are set so that the contamination and energy of the ions discharged from the sources are minimized. The several sources can be mounted in parallel and in series to provide a sustained ultra low source of ions in a plasma with contamination below practical detection limits. The quality of film along deposition "tracks" opposite the plasma sources can be measured and compared to desired absolute or relative values by optical and/or electrical sensors. Plasma quality can then be adjusted by adjusting the power current values, gas feed pressure/flow, gas mixtures or a combination of some or all of these to improve the match between the measured values and the desired values.

21 Claims, 11 Drawing Sheets

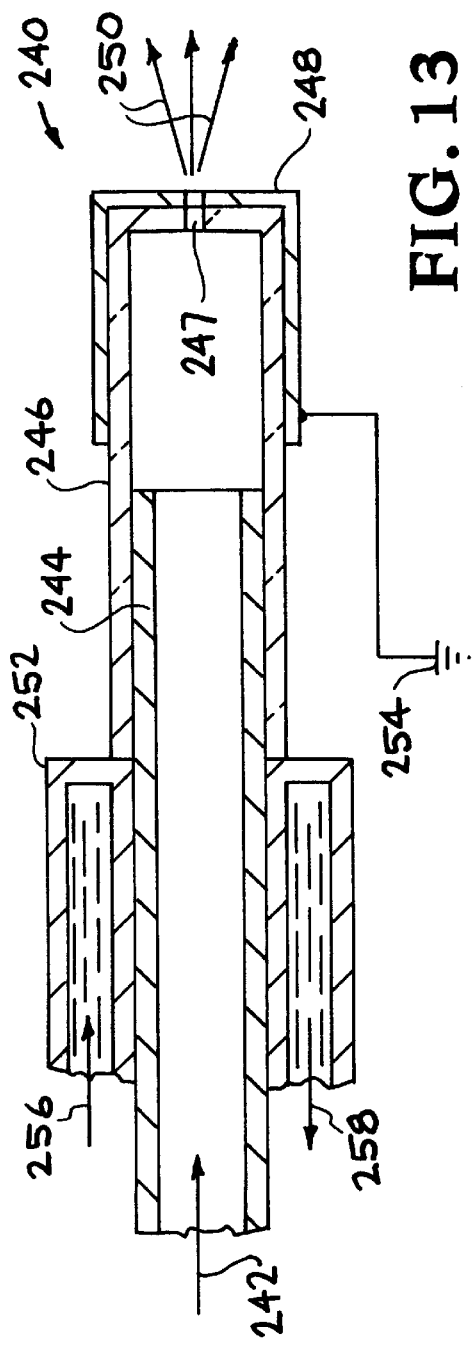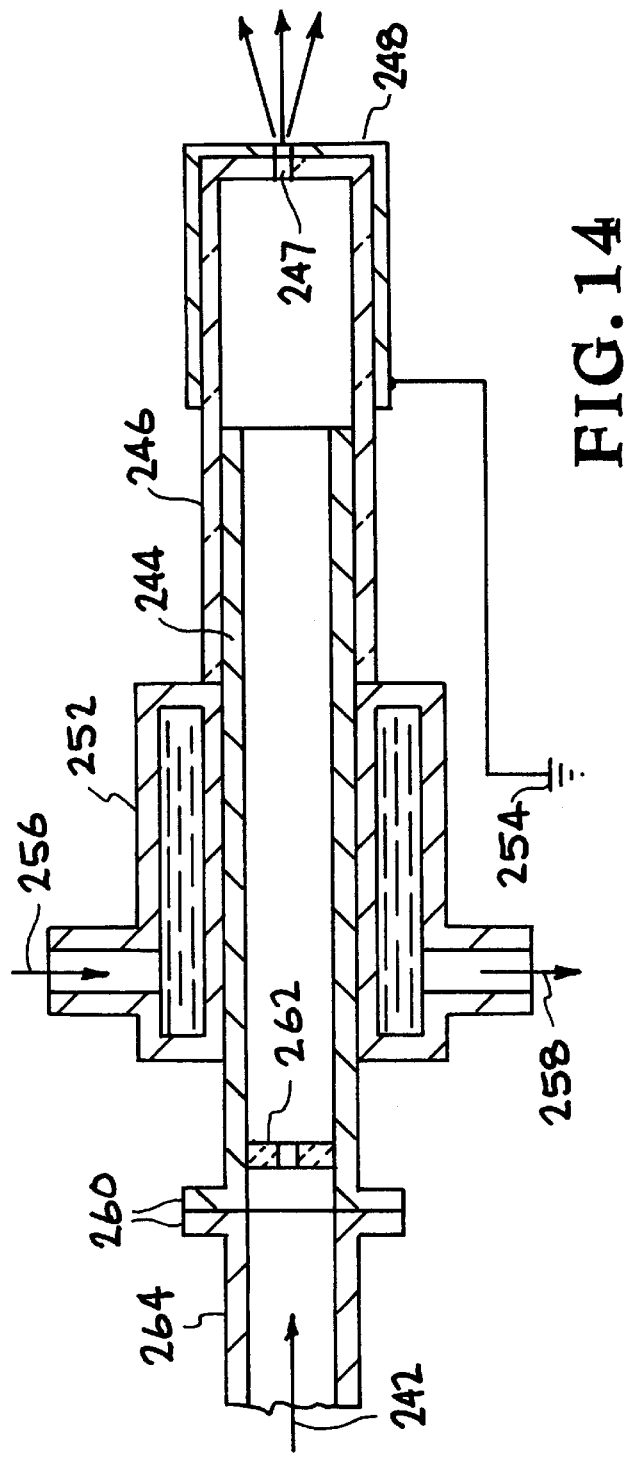

AUTOMATED CONTROL OF LINEAR CONSTRICTED PLASMA SOURCE ARRAY

RELATED APPLICATIONS

This application claims priority from provisional application serial No. 60/075,607 filed on Feb. 19, 1998 and claims priority as a continuation-in-part from application Ser. No. 08/711,844 filed on Sep. 10, 1996, pending.

FIELD OF THE INVENTION

This invention relates to structures and methods for producing and controlling the intensity of plasma along a linear array of plasma sources. Each plasma source having a very low level of contamination and low energy ions in a vacuum processing chamber, e.g., such as in those used to process compound films (e.g., oxide films), to synthesize thin films on the surface of a substrate.

BACKGROUND OF TEE INVENTION

In a vacuum processing chamber ion sources are used to change the properties of substrate surfaces. Gas is fed through an electric field in a vacuum chamber to excite the gas to a plasma state. The energized ions or excited neutrals (such as excited atoms and disassociated molecules) of gas constituents bombard the surface of the substrate. The effect that the ions have on the surface is dependent on their atomic constituents and their energy (in one example to treat a surface by providing active oxygen).

Low-energy, ultra-clean flows of plasmas are required, to obtain a crystalline film with high crystal quality as required in the case of gallium nitride (GaN). To avoid ion damage the ion energy must not be too high, for instance, an ion with a kinetic energy of 20 or more eV for GaN must be considered a high energy ion. When an ion hits the surface during crystalline film growth and its kinetic energy is high enough to displace atoms which are already in place, a defect is created. So the materials grown with energetic plasma streams tend to have lots of defects. The defects create "carrier" densities for semiconductors such as GaN, leading to the creation of a material with n-type doped properties. In these cases it is difficult to obtain a p-type doped material. To overcome this problem a source of low energy ions is needed.

A nitrogen plasma flow or low-energy ion beam (ion energy of order 30–50 eV) is usually obtained by using a Kaufman ion source or an Electron-Cyclotron-Resonance (ECR) plasma source.

The drawback of a Kaufman source is that a hot tungsten filament is used as a cathode. The tungsten filament delivers large quantities of electrons by thermionic emission, which sustain the low-energy non-self-sustained arc discharge, but tungsten atoms evaporate from the filament and can be found in the stream of plasma and the growing films. This is not acceptable for instance in the growth of GaN because the stream is not clean and the film properties are altered by the impurities, and is not acceptable for growth of oxide films, because the tungsten filament will oxidize rapidly.

An ECR plasma source necessarily operates with a high magnetic field to fulfill the resonance condition of microwave frequency and electron cyclotron frequency. Typically, the standard microwave frequency of 2.45 GHz is used, leading to a required magnetic field of 875 Gauss. The gaseous microwave plasma is produced in the region of the resonance magnetic field. The ions gain kinetic energy when leaving the location of the high magnetic field and streaming towards the substrate. When a plasma is made this way there is a significant energetic component in the ion energy distribution, i.e., ions having 30–50 eV of kinetic energy are abundant. This energy is too high for the growth of high quality crystalline films. Although ECR plasma sources are cleaner than Kaufman sources, ion damage is observed in growing films due to the relatively high ion energy. One way to overcome this energy problem is to bias the substrate electrically, to deflect the energetic ions but in doing so the low energy ions are also deflected and the growth rate decreases.

A better (cleaner) source of low-energy gaseous ions is needed to deposit high quality thin films on substrates in both research and commercial applications. This need includes not only MBE-type but also IBAD-type deposition of thin films (MYE=molecular beam epitaxy; that is film growth with reactive, activated gases; IBAD=ion beam assisted deposition, that is film growth assisted by the moderate kinetic energy of ions such as argon).

A plasma discharge chamber usable for an ion beam source, electron beam source, and a spectral light source was introduced by V. I. Miljevic and is described in several papers (Rev. Sci. Instrum. 55 (1984) 931; Rev. Sci. Instrum 63 (1992) 2619) (also see U.S. Pat. Nos. 4,871,918; 4,906, 890). A preliminary explanation of the working principle of the discharge is given in a paper published in *Plasma Sources Science & Technology*, Vol. 4. (1995) p.571.

In one configuration as shown in FIG. 1, a gas flows through a discharge chamber 20 which consists of a metal cathode 22 (grounded) and a metal anode 24 (positively biased) separated by a Teflon insulator 26. A flange 28 holds the anode 24 in place and seals it against the cathode flange using a series of O-rings 30. By applying a sufficiently high voltage (500 V or more) to the electrodes, a glow discharge ignites in the flowing gas. The gas is introduced through an opening 40 in the cathode, and leaves the source through a small aperture 38 in the anode. A high positive voltage is applied to an extraction electrode 32 leading to acceleration of the ions from the source 20 in the direction shown by arrow 36. A high negative voltage would accelerate electrons, turning the source into an electron beam source. An electromagnetic coil 34 produces a magnetic field around the anode 24 focusing the ions in an ion beam (whose direction is shown by the arrow 36) departing from the discharge opening 38 in the anode 24. Gas pressure supplied to the gas inlet 40 provides the motive force to discharge the ions from the discharge chamber 20. The extraction electrode 32 and magnetic coil 34 assist in accelerating and focusing the ion discharge into a beam. The anode 24 is insulated from the grounded cathode 22 and grounded support flange 28 by a thin film of ceramic coating deposited on the respective mating surfaces of the anode 24.

The feature which distinguishes this kind of discharge from an ordinary glow discharge is the actual exposure of a very small area of a large cross section anode facing the cathode, to the gas. In the Miljevic configuration this effect is obtained by blocking nearly all of the anode 24 by using an insulator 26, except for a small discharge aperture. This discharge aperture forms a small hollow anode, and Miljevic named the discharge "hollow-anode discharge". Related research has found (*Plasma Sources Science & Technology*, Vol. 4. (1995) p.571.) that a voltage drop appears in front of the discharge opening, accelerating electrons which gain enough energy to ionize the working gas through inelastic collisions. A bright "anode plasma" forms in the anode channel, and this plasma is blown out by the gas flow in the channel due to the pressure gradient between the inside and the outside of the source. The "anode plasma" does not form when there is no blocking or covering such a large anode.

SUMMARY OF THE INVENTION

A structure and method according to the invention involves using a special type of glow discharge plasma source, namely the so-called "Constricted Glow Discharge Plasma Source". The configuration of the prior art plasma source is adapted in a way that it delivers a downstream gaseous plasma of low contamination and very low kinetic energy, well-suited for the growth of high-quality thin films. The source can operate in a wide range of parameters, in particular it can also work at very low and very high gas pressures. It has been found that the anode does not necessarily need to form a small opening which is located next to the blocking insulator. The "hollow anode discharge" is just one possible configuration which makes use of a constriction element. A configuration according to the invention includes a special type of glow discharge characterized by a constriction between cathode and anode. The inventor(s) named this type "constricted glow discharge," and the derived downstream plasma source "constricted glow discharge plasma source."

The constricted glow discharge plasma source includes a discharge chamber where the potential of the cathode is below that of the anode, and the potential of the anode is approximately the same as the potential of the substrate being processed, thereby minimizing the energy of ions reaching the substrate. Having the substrate and anode at substantially the same potential, eliminates the accelerative effect on ions or electrons that a biased substrate would experience. Ion energy can be adjusted by biasing the substrate or changing the plasma potential (changing the anode potential). The configuration and method according to the invention provide a simple construction and operation of a low energy plasma source.

The source is simple, compact, and versatile. It can be used with a large number of surface modification techniques and thin film synthesis methods. Synthesis implies that some sort of chemical reaction occurs while depositing plasma constituents. A few applications which are already known include:

Growth of high-quality GaN thin films. GaN is a wide bandgap semiconductor with a number of applications such as blue light-emitting diodes, flat panel displays, and high temperature electronics applications. The constricted glow discharge plasma source has been shown to be a key element in achieving the required film quality by an MBE-type growth.

Gas streams in all versions of the source are fed to the discharge chamber. The electric field there causes the gas to become partially ionized and leaves the source through a constriction element located upstream of the anode.

The streaming plasma contains only low-energy ions (lower than 20 eV) because (1) the anode is positive, therefore attracting electrons but decelerating ions, and (2) a relatively dense, collisional plasma is formed in the upstream vicinity of the constriction element, in which energetic ions and neutral atoms lose their energy by collisions. The requirements of low ion energy (a few eV or less) for GaN film growth is therefore fulfilled.

The plasma stream from the source is clean because (1) no filament or other hot parts are used, (2) material sputtered by the ion bombardment from the cathode is—with a very high probability—deposited inside the discharge chamber since the output aperture of the constriction element is very small, (3) the source can be built of material tolerable or desirable to the specific application. For instance, a source has been construed where all plasma-facing components are made of high-purity aluminum (electrodes) and high-purity aluminum nitride ceramics (insulator parts). Such a source makes growth of high-quality thin films, such as GaN, possible.

It has been found that cathodes made from titanium show excellent long term stability when operating with nitrogen. A TiN film is formed on the surface of the cathode as a result of a chemical reaction of the cathode with the activated plasma nitrogen. Titanium nitride is sufficiently conductive to sustain the cathode function, but does not form an electrically insulating film as AlN eventually does.

Similarly, stainless steel (e.g., SS 304L) has also been used successfully as a cathode with oxygen because it does not form an insulating oxide film.

In general, a criterion for the selection of a cathode material for a given gas is that this material, if it reacts chemically with the gas, does not form an insulating film on the cathode surface. However, it may well form a conducting film.

An optimization of the configuration according to the invention, in particular the cathode shape and material adds new features to the source:

operation at an even wider range of pressures,
operating with reactive gases such as oxygen,
operating with unusual gases such as water vapor (for example it might be desirable to include a pre-defined amount of water or its constituents in films),
increased plasma output and stability, and
higher power and improved cooling.

A configuration according to the invention includes a source of plasma having a hollow enclosure with a gas inlet opening and a gas discharge opening. A cathode surface is exposed to an interior space of the enclosure and an anode surface is located downstream of a constriction element, a gas is fed to the gas inlet opening and plasma is emitted from the discharge opening of the constriction element. The shape of the opening of constriction element can be round or elongated (rectangular). In other configurations the source is fluid cooled (liquid or gas) and/or the cathode is insulated from the surrounding environment, so that all exterior surfaces of the source are safely at ground potential. The cathode can be a hollow configuration to increase its surface area, and the inlet gas passage can include a small inlet orifice to prevent a discharge in the gas feed line. The geometric relationship between the substrate and the source may be fixed or variable during processing.

In another configuration according to the invention, two plasma chambers are constructed in series; the first chamber feeds the second chamber with plasma. This increases the stability and density of the plasma emitted and reduces the probability that a high energy particle will be generated and leave the second chamber through its discharge opening of the constriction element.

The plasma source cells can also be configured in parallel, to provide several plasma streams toward a substrate.

The source can be constructed and operated in a way that the anode is remote from the small discharge opening of the constriction element. This can be done, for instance, by applying the negative potential to the cathode as previously described but keeping the other source parts (such as housing and the other metal parts adjacent to the blocking insulator) electrically floating. The anode can be a separate ring or tube located downstream of the main body of the plasma source. The anode can be attached to the main body (forming a unit) or detached from it. In an extreme case, the substrate, substrate holder, and the chamber wall can function as the anode, and no dedicated anode part is necessary. In all cases, the discharge is constricted to a small area ("discharge opening of the constriction element.") such that a voltage drop forms at this flow constriction. The flow of current between the interior cathode and the exterior anode is concentrated at the flow constriction. This causes plasma production as described above, and the plasma formed at the flow restriction is blown to the substrate by the pressure gradient.

The source can operate with all kinds of gases. Besides nitrogen, sources have been tested running with argon, air, water vapor, ammonia and oxygen. The latter is important, for instance, for the deposition of oxide films. Since the source can operate at a high pressure typical for sputter deposition of thin films, plasma-assisted sputter deposition becomes feasible by combining one or several constricted glow discharge plasma sources with magnetron sputtering and laser ablation facilities. This could have great impact on the deposition of oxide films for controlling the passage of sunlight and electrochrornic windows and deposition of high temperature superconducting films such as yttrium barium copper oxide. The use of the source configuration according to the invention with oxygen promotes the enhanced incorporation of oxygen in the surface layer, as the concentration of oxygen is usually too low in the original as-deposited films.

A source according to the invention is well suited to produce a nitrogen plasma used for the MBE growth of gallium nitride films on heated substrates such as sapphire and silicon carbide.

Other gasses excited to a plasma state can be used with a source according to the invention.

Operation of the source with an inert gas such as argon at low pressures can be useful for IBAD thin film deposition.

The lifetime of constricted glow discharge plasma sources in a configuration according to the invention is much longer than sources operating with hot filaments. This is generally true but in particular when operating with oxygen, because hot filaments burn easily in oxidizing environments.

A method according to the invention includes the steps of: feeding a gas into a hollow discharge cell, applying a DC voltage to form a plasma in the discharge cell including a small constriction area such as to provide a downstream plasma flow with low energy ions to help synthesize nitride films, such as gallium nitride, on suitable substrates such as AlN, sapphire, and SiC, and to synthesize oxide films such as tungsten oxide films on glass or other substrates, and to synthesize a yttrium barium copper oxide film by exposing such films to an oxygen plasma to obtain an increased concentration of oxygen atoms in the film, and to assist the growth of thin films such as metal films by providing low energy ions such as argon ions.

A device according to the invention provides for (1) Plasma assisted deposition of oxide films on large area substrates, including dielectric substrates such as glass and plastics (webs).

In one case, the source runs with oxygen as the feed gas. The oxide films can be: (a) indium tin oxide, a transparent, conductive coating (part of multilayer electrochromic films (variable optical transmission) or heatable glass for luxury car windows); (b) ion conducting oxide films such as tungsten oxide (part of the electrochromic multilayer structure); (c) solar control films (such as zinc oxide films); and (d) anti-diffusion barrier films such as aluminum oxide (used, for instance, on plastic packaging for potato chips; the coatings prevent the diffusion of water and oxygen thus help to keep the food fresh).

(2) Plasma assisted deposition of nitride films.

The source can operate with all gases, and when used with nitrogen, nitride films can be deposited.

A most interesting and promising version of the Constricted Plasma Source (CPS) is a linear array of miniaturized discharge cells. The arrangement as with sources in parallel was only recently reduced to practice because each source in the earlier configuration was too large in diameter to allow the necessary close spacing needed for a homogeneous plasma. Close spacing of the sources (discharge cells) is mandatory to obtain acceptable plasma homogeneity along the array.

A device according to the invention may include a plasma source in which the constriction is not circular but a narrow slit. This allows the formation of a "linear" plasma. However, when the slit becomes very long (say, several inches), the plasma tends to concentrate at some-part of the slit thus the output is not homogeneous along the whole slit length. Combining the pencil-sized source with the quasi-linear array as mentioned earlier, a quasi-linear source with acceptable homogeneity could be reduced to practice for the first time.

The term "quasi-linear CPS" refers to a multicell Constricted Plasma Source whose discharge cells are aligned and operate with constricted glow discharge cells with small circular constrictions. The term "linear CPS" refers to a multicell Constricted Plasma Source whose discharge cells are aligned and operate with constricted glow discharge cells having slit-shaped constrictions.

A device according to the invention includes an elegant and compact small diameter source design. This miniaturized source can be used in two ways. First, it can be used as a stand-alone device, for instance in the geometry required for ultra-high-vacuum molecular-beam-epitaxy deposition facilities. Second, the small diameter of a plasma source cell allows several of them to be arranged closely spaced in a linear fashion, forming the quasi-linear CPS, as discussed earlier.

The miniaturized discharge cell can also have a slit rather than a circular hole as the constriction. The slit would be relatively short (some mm) in this case because the overall discharge cell is small. Many of these smaller slit sources can be arranged to form a linear plasma source of arbitrary length.

The cells of a quasi-linear or linear CPS can be tuned to improve homogeneity of the plasma process such as the deposition of a compound film. Moreover, a desired or programmed output profile can be obtained. A flat, homogenous and constant output profile is one example of a possible desired output.

(1) The cells of the CPS can be operated independently from each other by using
  (a) independently controlled power which may, for instance, be obtained by operating individual power supply modules in current limit mode
  (b) independently controlled individual gas feeds Methods 1(a) and 1(b) can be used together or independently to achieve a desired output profile.

(2) The distance between individual source cells can be adjusted and optimized for a desired profile. For instance, if a homogeneous plasma profile is desired, the cells in the center of a quasi-linear source are nearly spaced equally but the distance between cells decreases the closer a cell is at one of the ends of the arrangement.

BRIEF DESCRIPTION OF THE DRAWINGS

FIG. 13 shows a schematic cross sectional view of a pencil-sized source according to the invention;

FIG. 14 shows the pencil sized plasma source of FIG. 13 connected to a gas feed source fitting;

DETAILED DESCRIPTION

Structures and methods according to the invention include several versions of constricted glow discharge plasma sources. In contrast to Miljevic's high energy focused electron and ion (beam) source, the anode is the most downstream electrode and kept at ground potential to generate a flow of low-energy plasma.

Figure 1:
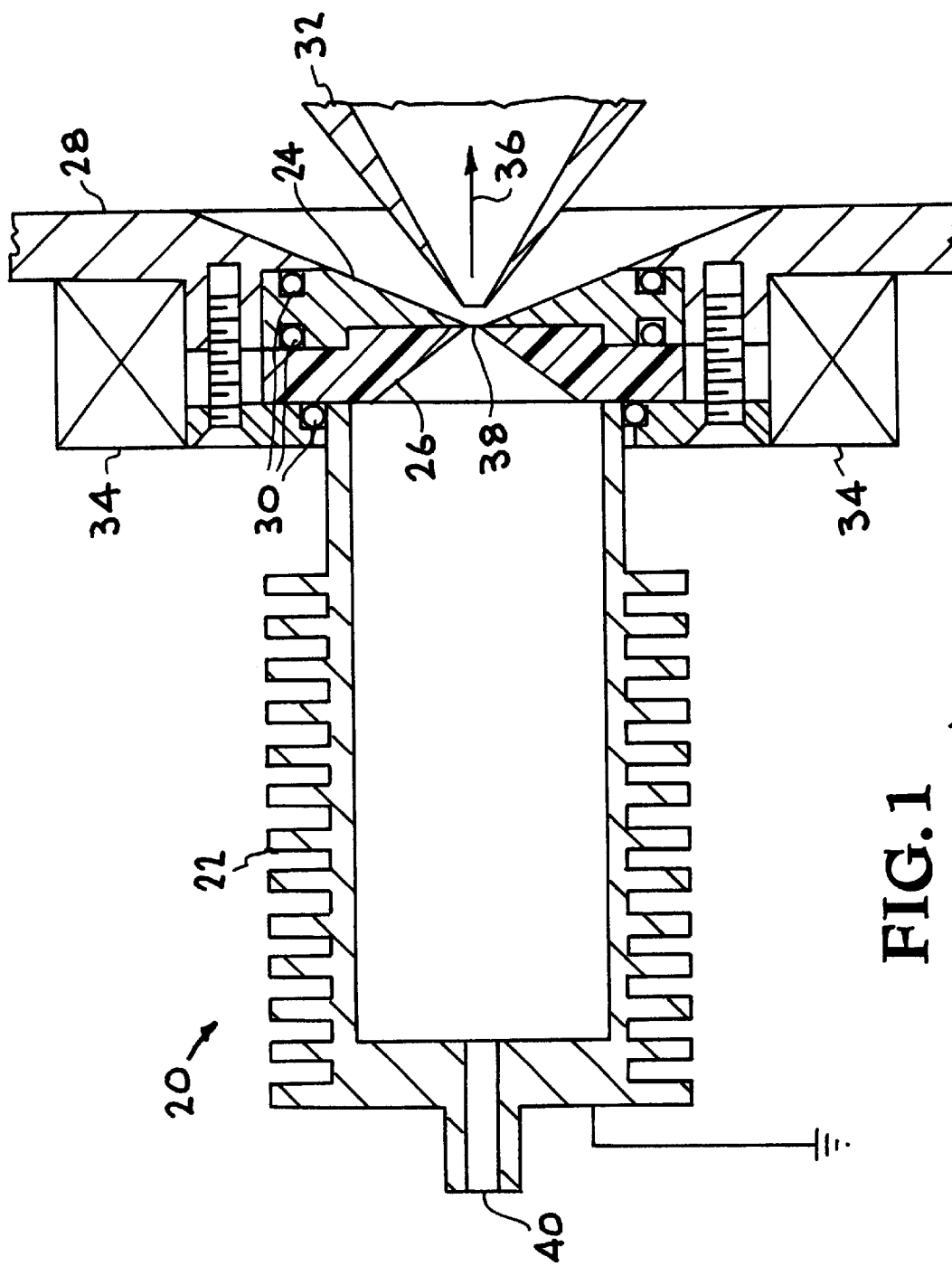
FIG. 1 is a cross sectional schematic view of a prior art hollow-anode ion beam source.
Figure 2:
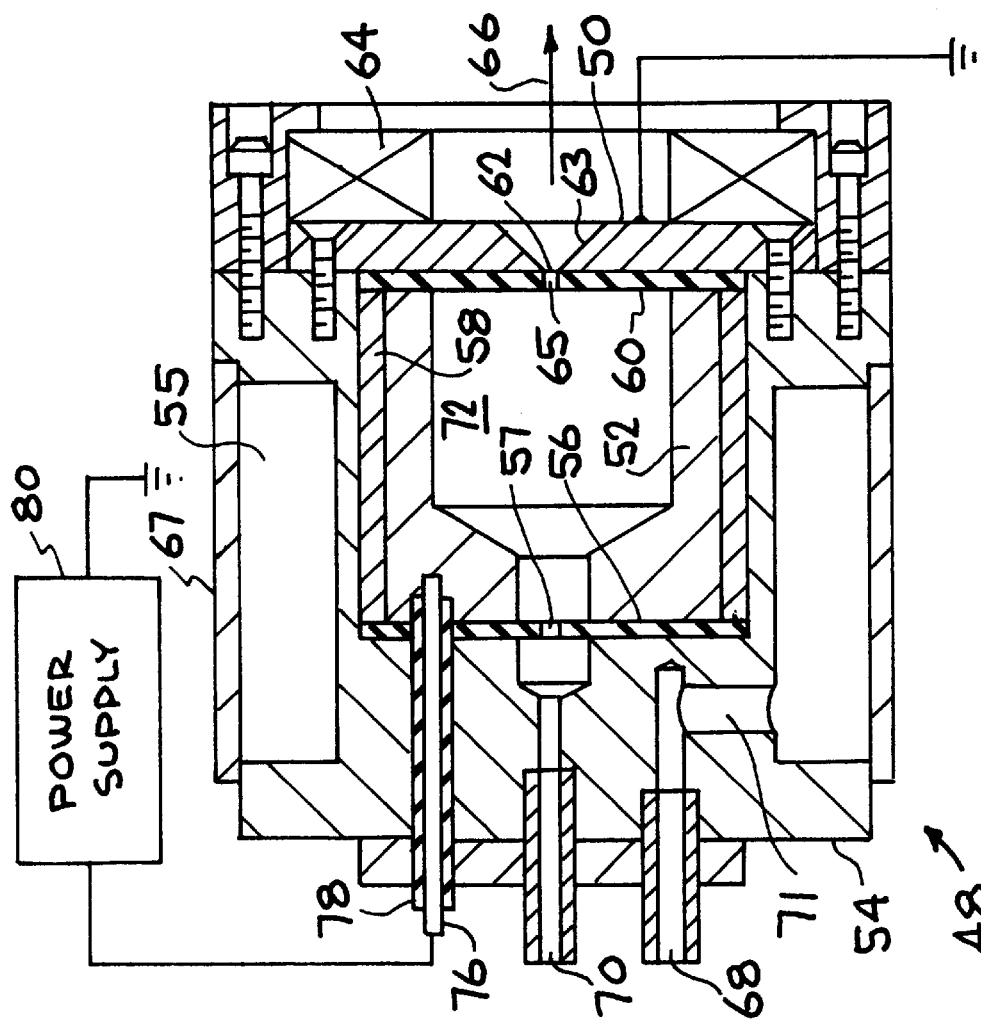
FIG. 2 is a cross sectional schematic view of a constricted glow discharge plasma source with all exterior surfaces at ground potential, in a configuration according to the invention.
Figure 3:
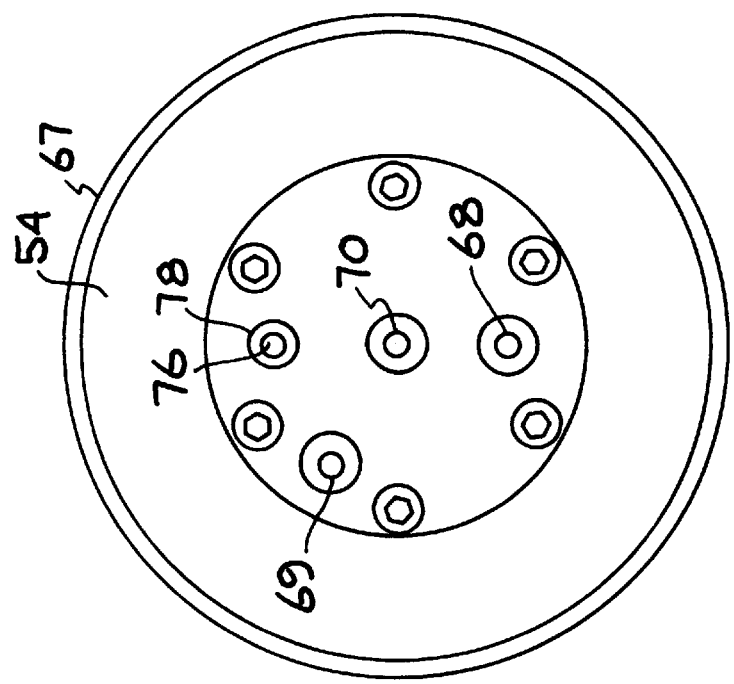
FIG. 3 is an end view of the source as shown in FIG. 2.

As shown in FIGS. 2 and 3 the anode plate 50 is grounded because the substrate (not shown) is usually grounded. This is to avoid creating an electric field between the source and the substrate which would accelerate the ions in the plasma. Having the anode 50 grounded defines one boundary condition of the configuration. Consequently, the cathode 52 has to be negative (a potential less than ground). Therefore the cathode 52 cannot be directly mounted to the chamber or to a holder connected to the chamber because the chamber is always grounded (for safety reasons). The cathode 52 has to be electrically insulated from the surrounding metal parts 50 and 54.

In one configuration the outside surface of the body of source 48 is kept at ground, the same potential as the chamber, so that all kinds of holders and clamps can be attached to the body 54. In the configuration of FIGS. 2 and 3, the source body 54 is grounded and separated from the cathode 52 by a thin ceramic disk 56 (e.g., made of AlN approximately 0.25 mm thick) and by a surrounding cylindrical sleeve 58 (preferably made of stainless steel).

The anode 50 is separated from the edge of the hollow cathode 52 by a ceramic disk 60. The ceramic disk 60 acts as an anode insulating barrier covering all but a small portion of the anode. A discharge opening 62 (0.05–1.0 mm) provides a passage through the disk 60 and is the origin of a low energy plasma stream (not shown).

At the discharge end of the source 48 the anode 50 is bolted to the body 54. A magnetic member 64 can be positioned outside the anode 50. The magnetic member 64 can be an electromagnet or a permanent magnet. The magnetic field will enhance the plasma production at the discharge opening 62 and reduce the expansion of the plasma as it exits the anode discharge opening 62. The cone 63 of the anode discharge opening 62 forms a large angled (90 degree or wider angle) nozzle at the end of the discharge passage 65 through the anode 50. The shorter the discharge passage 65 and the wider the discharge cone 63 the better the plasma production flowing in the direction shown by an arrow 66.

The function of the magnet member 64 here is to magnetically insulate the anode 50 to enhance the voltage drop and electric sheaths thickness located at the constriction opening. This is achieved by using an axial magnetic field, i.e. the magnetic field lines are aligned with the axis of symmetry of the discharge cell.

Figure 5:
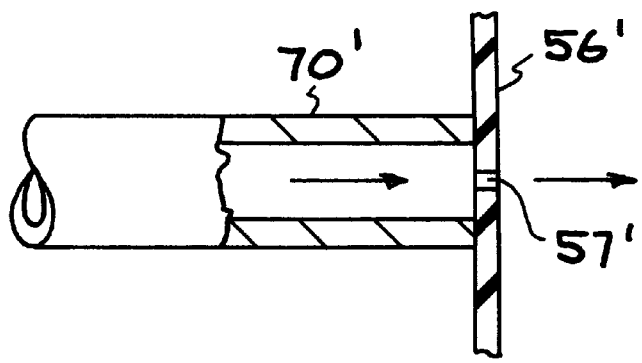
FIG. 5 shows a cross sectional close-up view of the gas feed passage of the type used for the source of FIG. 2 showing an orifice in the passageway into the interior space of the source formed by an insulating ring/disk between the cathode and the member adjacent to it.

The gas inlet tube 70 provides gas to the interior hollow space 72 of the body 54 and the center of the hollow cathode 52. As gas travels through the inlet passage tube 70, a restriction to gas flow is imposed by the hole 57 (0.05–1.0 mm in dia.) in the insulating disk 56. The disk 56 can be configured as shown in FIG. 2, or in an alternate configuration as shown in FIG. 5. In FIG. 5 an inlet tube 70' closely approaches an insulating disk 56' such that an inlet hole 57' acts as an orifice to establish a high pressure on the upstream side to prevent plasma from forming in the inlet tube 70'. According to Paschen's Law, the higher the gas pressure the greater the voltage that will be needed to ionize the gas. The separation of regions of high and low pressure by the orifice 57' assures that ionization will only occur on the low pressure side of the orifice and back burning of the feed passage will thereby be prevented.

Figure 4:
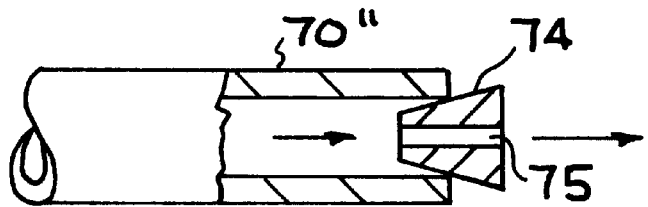
FIG. 4 shows a cross sectional close-up view of a gas feed passage of the type used for the source of FIG. 2 showing an orifice in the passageway into the interior space of the source formed by a plug positioned in the end of the passage.

A similar function is performed by the configuration as shown in FIG. 4. A gas inlet tube 70" is fitted with an orifice plug 74 having an orifice 75 (0.05–1.0 mm in dia.) to create the differential pressure required to prevent back burning. On the high pressure side, electrons collide often elastically with gas molecules and thus cannot gain sufficient energy between collisions to allow them to ionize. Thus, plasma is not formed in the high pressure region. This backburning situation does not occur in the prior art as the polarity there is different.

The inlet end of the source 48 also includes a power supply post 76 connected to the cathode 52 through an insulating sleeve 78. A DC power supply 80 supplies power to the post 76. The source body 54, (preferably made of stainless steel) includes an annular channel 55 enclosed by an annular channel-enclosing cylinder 67. A water inlet tube 68 and a water outlet tube 69 (FIG. 3) circulate water (or other cooling liquid) through the annular channel 55, through a set of water cooling passages (e.g., 71) only one of which can be seen in FIG. 2. The cathode temperature during operation is estimated to be 100 degrees Celsius.

Figure 6:
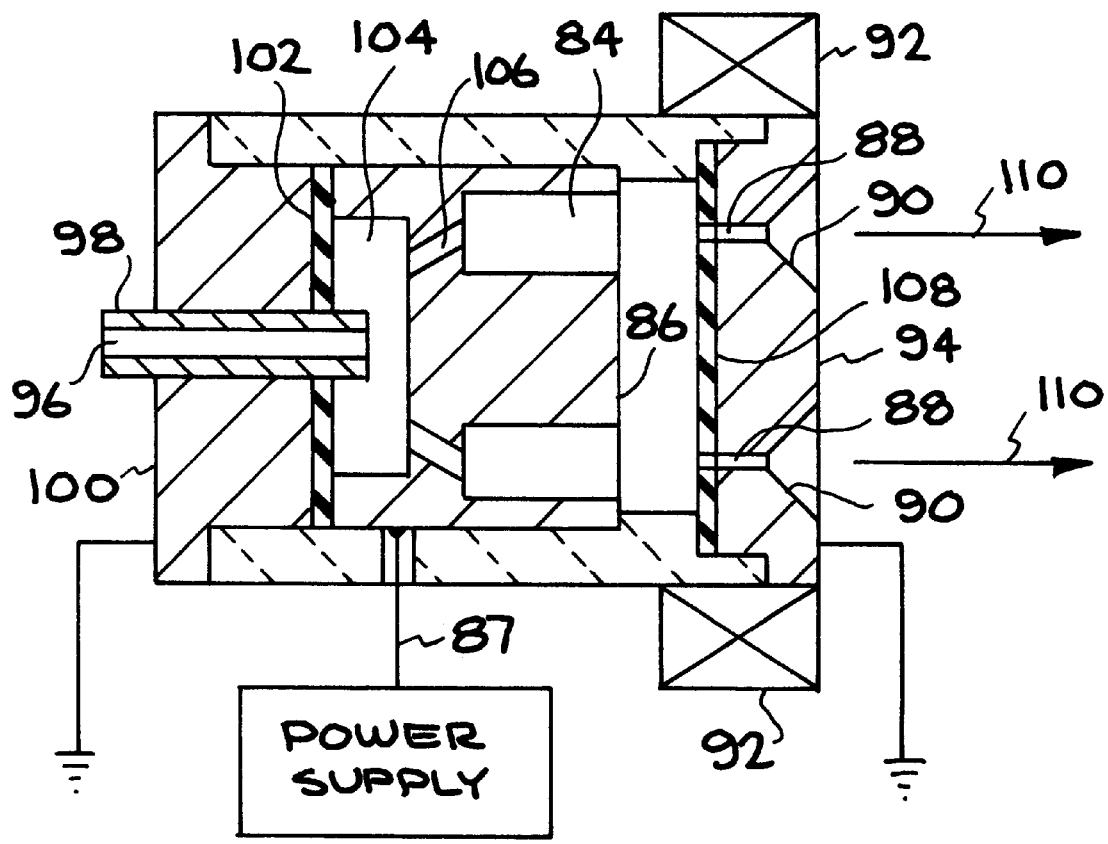
FIG. 6 is a cross sectional schematic view of a constricted glow discharge plasma source with a hollow-cathode with multiple constriction apertures and a magnetic field coil, according to the invention.

FIG. 6 shows a configuration according to the invention having several hollow cathode spaces (e.g., 84) in the cathode 86. Each hollow cathode space (e.g., 84) faces a constriction opening (e.g., 88). As configured in FIG. 6 there are 6 constriction openings generally equally spaced along the circumference of a circle (a seventh constriction opening of the set is configured at the center axis of the cathode and is not shown for clarity). Each constriction opening (e.g., 88) has a discharge cone (e.g., 90). A magnetic member 92 is shown surrounding the outside of an anode 94.

Gas for the plasma is supplied to a gas inlet 96 through a gas inlet tube 98 through a grounded backing member 100 and a ceramic (e.g., AlN or $Al_2O_3$) insulating disk 102 into a cathode inlet plenum 104. From the inlet plenum 104 each hollow cathode space (e.g., 84) is connected to the plenum 104 by its own connection passage (e.g., 106). The hollow space (e.g., 84) increases the surface area of the cathode 86 exposed to the gas flow and subject to the electric field between the cathode 86 and the anode 94. An insulating constriction disk 108 having 6 constriction openings (or 7 if the unillustrated center constriction opening is included) therein matching the location of the constriction openings (e.g., 88) in the anode covers substantially all of the anode 94. Power to the cathode is supplied through a power connection 87. Plasma produced at the location of the passages and constriction openings (e.g., 88) travels in the direction of the arrows (e.g., 110).

Figure 7:
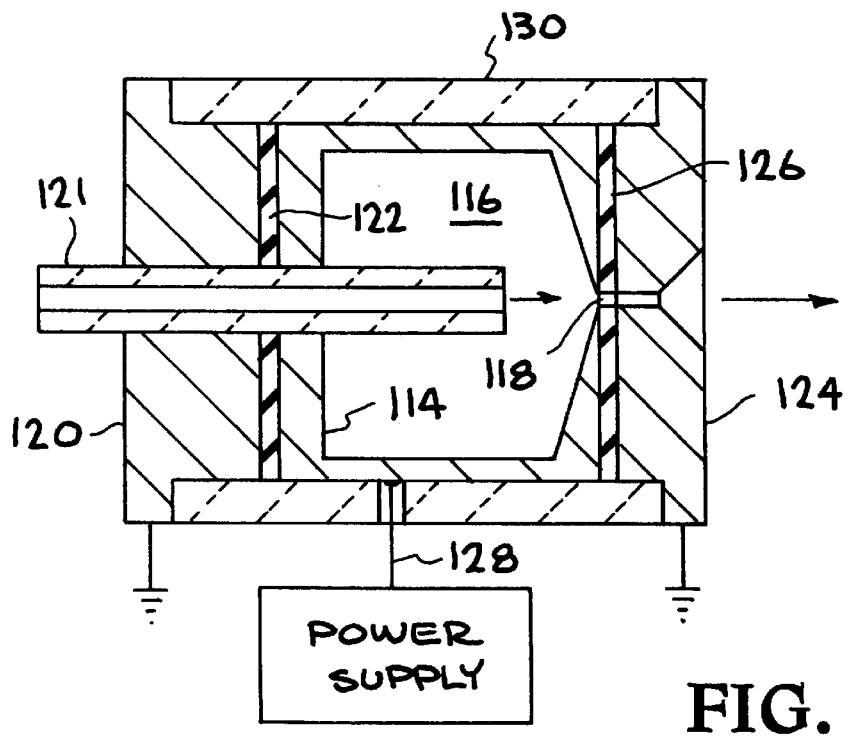
FIG. 7 is a cross sectional schematic view of a constricted glow discharge plasma source with a hollow-cathode with both ends at ground potential, in a configuration according to the invention.

When using a hollow cathode configuration as shown in FIGS. 6 and 7, the source will operate more efficiently and with greater stability (constricted glow discharge plasma source with hollow cathode). The utilization of the hollow-cathode effect (i.e., electrons oscillate in the cathode cavity due to electrostatic reflections from the cathode sheath, and thereby increase the probability of colliding inelastically with gas molecules to create ions as the cavity is repeatedly crossed) significantly increases the generation of plasma over a configuration with a flat faced cathode.

An advantage of using a hollow cathode is that the pressure range in which the source can operate, is widened. Different embodiments have been tested which operate in the very wide range of $9 \times 10^{-6}$ Torr to 0.5 Torr (pressure measured outside the source, i.e. in the vacuum chamber).

FIG. 7 shows a configuration of a hollow cathode 114 for use with a configuration according to the invention. The large cathode area enhances the generation of a plasma so that a plasma can be initiated and supported at lower voltages than if the surface area of the cathode were smaller. The use of a lower voltage reduces the energy of ions generated in the second chamber.

The small diameter (~0.5 to 1.0 mm) of the constriction opening 118, further reduces the probability that high energy ions will leave the source. A ceramic inlet tube 121 supplies gas to the hollow cathode space 116. The gas, in plasma form, is discharged through the discharge hole 118. The hollow cathode 114 is insulated from the back plate 120 by an insulating disk 122 (in this configuration made of a ceramic material). The anode 124 is separated from the hollow cathode 114 by an anode insulating barrier 126, made of a ceramic material approx. 0.25 mm thick and having a hole to match the constriction opening 118 of the source. The surrounding wall 130 is a hollow ceramic cylinder (preferably made of AlN). The hollow cathode 114 is powered by a power supply connection 128.

Figure 8:
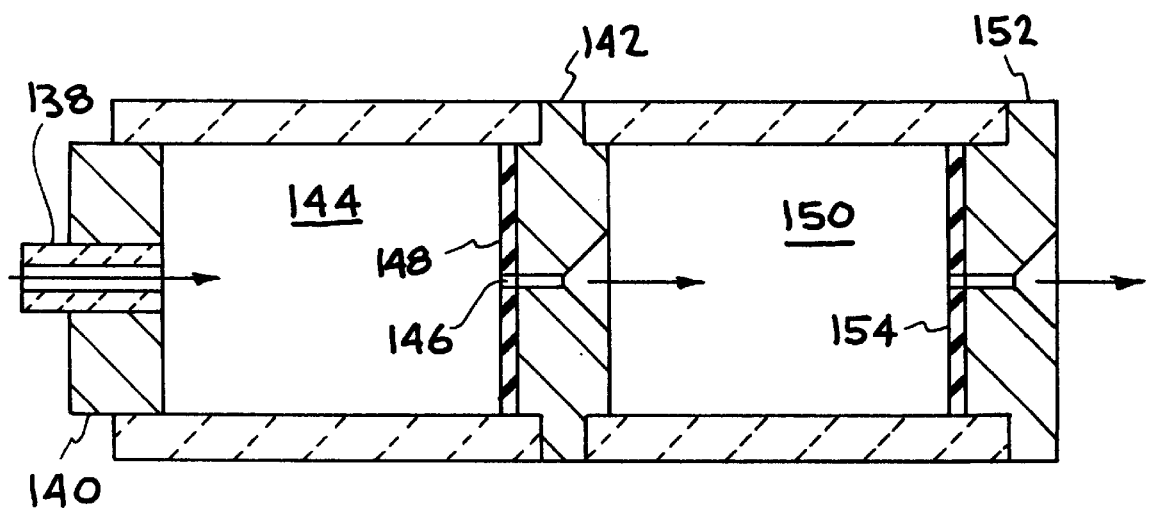
FIG. 8 is a cross sectional schematic view of a constricted glow discharge plasma source in a dual stage configuration according to the invention.

In a constricted glow discharge plasma source configuration as shown in FIG. 8, a second discharge chamber is added to the "single-stage" constricted glow discharge ("dual-stage constricted glow discharge plasma source"). Gas is supplied through a feed passage 138 (here pictured as a ceramic material) to a first chamber 144 through a 1st cathode 140. An electric field is created in the first chamber 144 by the difference in potential between the first cathode 140 and an intermediate anode/cathode electrode 142 which is insulated from the first chamber 144 by a first insulating anode barrier (constriction element) 148 causes the gas injected therein to form a plasma. The first chamber 144 includes an intermediate constriction opening 146 which routes the plasma from the first chamber 144 to the second chamber 150. The electric field in the second chamber 150 (created by the difference in potential between the intermediate anode/cathode electrode 142 and a second anode 152) excites the gas in the second chamber 150 to form a plasma. The second anode 152 is covered by a second insulating constriction opening 154.

In this dual stage configuration, the additional (first) chamber can be any source for a gas discharge (plasma), but a constriction glow discharge chamber is preferred. The discharge chambers are connected in such a way that the gas is first fed to the additional chamber. The plasma from the first discharge chamber (or cell) 144 streams into the main chamber 150 of the constriction glow discharge, driven by a pressure gradient. The purposes of the additional chamber are (1) to inject plasma into the main constriction glow discharge (one may consider the first chamber as a replacement of the filament cathode), (2) to provide a plasma source to initiate the main discharge, and (3) to reduce the anode-cathode voltage drop in the main chamber and reduce the associated cathode sputtering.

The benefit of the two inline chambers is that the downstream chamber (i.e., 150) can burn at a lower voltage because the plasma making is promoted by the plasma streaming in from the first stage. The burning voltage between the cathode 142 and anode 152 in the final stage (e.g., 150) can be smaller than usual, because this discharge is supported by a plasma input stream coming from the first stage (e.g., 144).

There is also a process benefit, if problems are encountered with contamination coming from a sputtered cathode material, caused by the excessive sputtering of the cathode which depends strongly on the magnitude of the energy of the ions hitting the cathode. The magnitude of the energy can be reduced by reducing the burning voltage. When this is done with a single stage source, the plasma production will go down and it will eventually stop completely.

In the two stage configuration it is possible to keep the plasma production alive because plasma is fed to the second chamber (e.g., 150), so the voltage of the final stage 150 can still be reduced and still have enough plasma to provide a reasonable process rate. This configuration provides the benefit of reducing contamination while being easier to operate and having a higher output plasma density.

Figure 9:
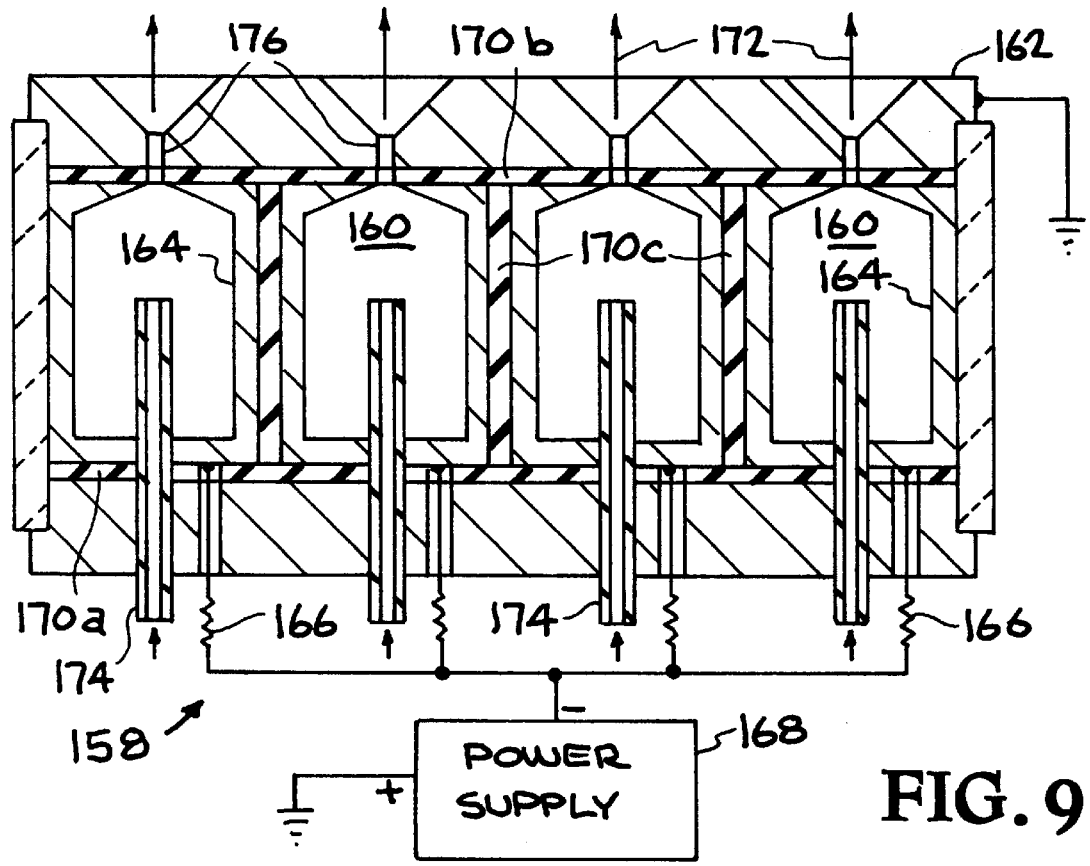
FIG. 9 is a cross sectional schematic view of a quasi-linear, constricted glow discharge plasma source with hollow-cathodes according to the invention.

Constriction glow discharge plasma sources with a hollow cathode can be built as single or dual-stage point sources or as quasi-linear or multiple point sources as shown in FIG. 9.

Most sources are cylindrically shaped. The quasi linear source as shown in FIG. 9 has a rectangular cross section.

FIG. 9 shows a quasi linear source would be here the design of choice since large area substrates (window glass) are to be treated.

FIG. 9 shows another version of the constricted glow discharge plasma source, a quasi-linear constricted glow discharge plasma source 158. It is characterized by using several individual constricted glow discharge plasma source cells 160 which are closely aligned in a row.

The source can behave even more like a linear source by using constriction openings which are elongated ("slots") along the row.

For convenience a common "quasi linear" anode 162 with individual cathodes (e.g., 164) is used, separated from adjacent cathodes and grounded members by a series of insulators 170a,b,c. For stability reasons, each cathode (e.g., 164) has its individual load resistor (e.g., 166) (or power supply unit operating in a current mode), but conveniently a single power supply 168 can be used. The advantage of a "quasi linear" source is that large substrate areas can be homogeneously treated with the outwardly streaming plasma by using a one-dimensional motion of the substrate (perpendicular to the direction of line of the constriction openings). The individual feed lines 174 to each chamber assure equal burning at the discharge of each chamber's constriction opening 176.

Typically the sources described above range from 1.5 to 4 inches in diameter and are about 3 inches in length.

Figure 10:
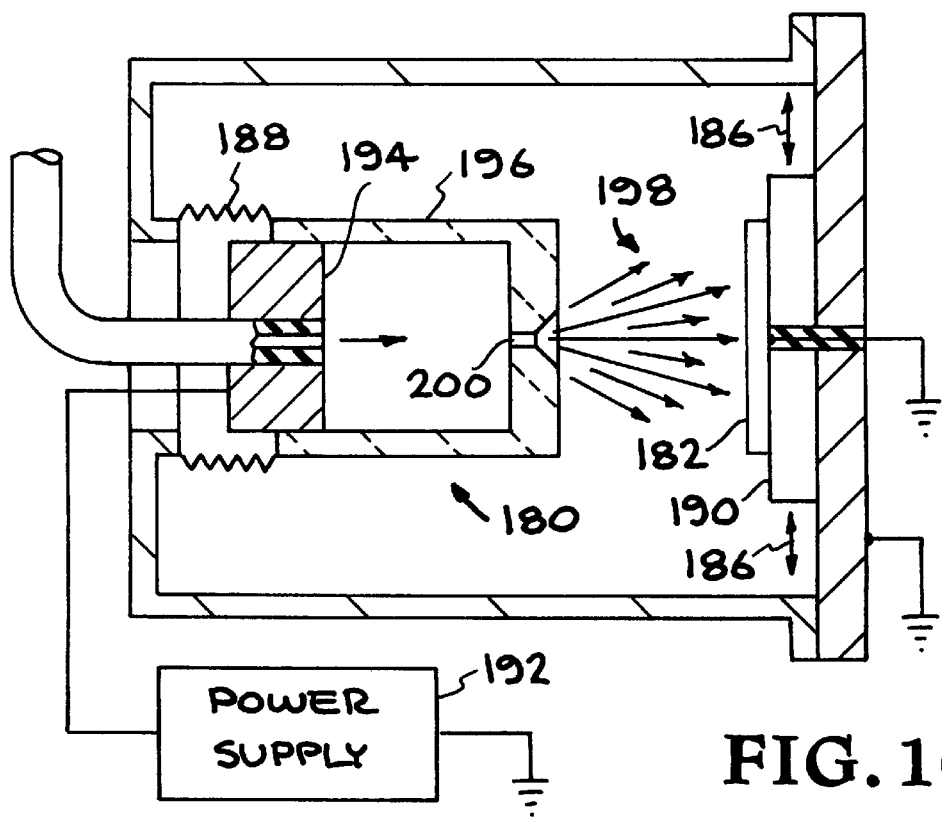
FIG. 10 is a cross sectional schematic view of a constricted glow discharge plasma source where the cathode is inside a gas feed chamber while the anode is outside the enclosure and is connected to the wall of the chamber.

As shown in FIG. 10, the source 180 and substrate 182 can be stationary or can be moved as shown by the arrows 184 during processing to process the full area of the substrate 182 although the source 180 and substrate 182 in a stationary position can deposit on a less than full area of the substrate being processed. It is also possible to scan the plasma flow across the substrate by magnetic field coils (not shown). The distance between the source 180 and the substrate 182 can be adjusted by bellows 188, while the substrate 182 and substrate support 190 include mechanisms (the details of are not shown but are understood by persons of ordinary skill in the art) to move the substrate 182 in a predetermined pattern. In this configuration only the cathode is powered by the power supply 192 and the cathode container 196 is allowed to float while a plasma 198 is allowed to stream from the constriction opening 200 of the container 196 toward the substrate 182 and substrate support 190 which are both grounded.

While the Figures show the plasma source to be mounted in a horizontal configuration, a vertical or other angled mounting is possible as the effect of gravity on the process, if any, is negligible.

In one configuration, where the growth of gallium nitride is intended, the distance between the source and the substrate is approximately 4 to 5 inches. The pressure in the processing chamber is in the low $10^{-4}$ Torr range, and all gas injected into the processing chamber comes in through the plasma source. The gas is pure nitrogen injected at a flow rate of approximately 5–50 sccm.

The output of the source can be increased by using an axial magnetic field. Experiments show that this is true for sources with a single constriction opening as well as with several openings.

All above described sources can be operated with an external magnetic field which helps to stabilize the discharge and increases the plasma output.

All above described sources can be built in such a way that they are UHV (ultra high vacuum, i.e. residual pressure $10^{-9}$ Torr or less) compatible and made of the materials acceptable to the specific application. This implies, for instance, to avoid plastic materials and O-ring sealing; instead, only UHV metals such as stainless steel, aluminum, and ceramics such as AlN and $Al_2O_3$ are used.

The cathodes of the sources shown in FIGS. 2–10 are indirectly cooled via heat conduction through thin insulating ceramics such as AlN. It is principally possible to implement direct cooling of the cathode by a cooling liquid such as water. This is only necessary for very high power levels. The construction with direct cathode cooling requires the use of electric breaks separating the cathode potential (negative) from ground. Care must also be exercised to keep the gas supply insulated from the power source.

A constricted glow discharge plasma source has been used to form lithium nitride on lithium battery electrodes by nitrogen plasma immersion ion implantation to form a nitrogen-enriched lithium surface.

Where a gallium nitride film is to be grown using a nitrogen gas it is preferred that the substrate be a crystalline material. The crystalline material may be such that it has a lattice constant generally matched to that of the substrate such as SiC and bulk GaN. Or the crystalline material may be such that it has a lattice constant generally not matched with that of the substrate such as sapphire.

Other nitride films might also be synthesized. It may be possible to assist the growth of carbon nitrides using the constricted plasma source.

A method according to the invention may include use of the structure and method according to the invention while simultaneously bombarding said substrate with a stream of material for growth of film on the substrate. The source then acts as a low energy ion beam assist to epitaxy deposition. In this configuration the low energy beam reduces the likelihood of defect formation, which higher energy ions have a high probability of producing.

A further development of the constricted glow discharge, and combination of the discharge with extractor systems can lead to a variety of ion and electron sources. Another way of obtaining energetic particles (e.g. keV range of energy) is to bias the source or substrate in order to obtain an accelerating electric field; adjustments can also be done by magnetic fields. Thus the source is also applicable to materials synthesis and modification where energetic particles are required.

The Hollow-Anode Discharge is characterized by a small constriction (usually a hole of about 1 mm diameter) with an adjacent anode with an aligned hole (the hole is "hollow"— that's why the name "hollow anode discharge.")

The hollow-anode discharge is used for materials processing such as the epitaxial growth of gallium nitride. The hollow anode plasma source can operate with all gases, including oxygen.

For some practical purposes of large-area coatings, at it desirable to have a linear source (i.e., the plasma output comes from a long slit rather than a hole), to move the to-be-coated substrate perpendicular to the slit. As discussed above, a quasi-linear source can be realized by aligning the output holes of several sources (FIG. 9).

This solution is straight forward once a single-hole source has been shown to produce the desired plasma. A single source can also operate with several holes. However, it has been found experimentally that the discharge will not utilize all holes in an equal manner but operate preferentially with one or two holes.

With the need to implement an oxygen-plasma assisted deposition process for the deposition of large-area conductive transparent films (like indium tin oxide), solar control films (like zinc oxide and tungsten oxide) on glass and plastics (webs), and anti-diffusion barrier films (like aluminum oxide films) on packing materials, the development of a linear source is needed.

Figure 11:
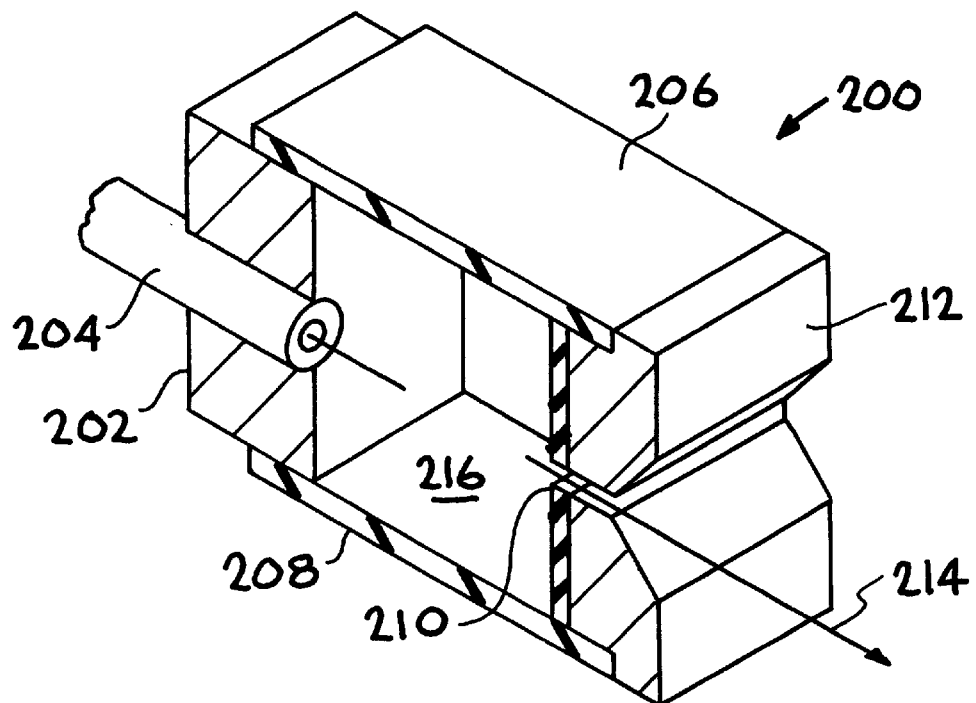
FIG. 11 shows a constricted glow discharge in a hollow-anode configuration with a slit opening.

A linear source with a slit opening is shown in FIG. 11. Extending the ideas and principles discussed above, a very thin slit having a width of a fraction of a millimeter for both the ceramnic plates (blocking most of the anode area) and the adjacent anode FIG. 11) was built and aligned.

FIG. 11 shows a constricted glow discharge in a hollow-anode configuration with a slit opening 200. A gas feed 204 extends through a block cathode 202 to feed gas into an internal chamber 216 that is closed on the top by a top insulator 206 and on the bottom by a bottom insulator 208. An insulating anode barrier with slit 210 insulates the bulk of the anode with slit 212 from direct exposure to the internal chamber 216. The arrow 214 shows the direction of plasma flow through the slit.

Figure 12:
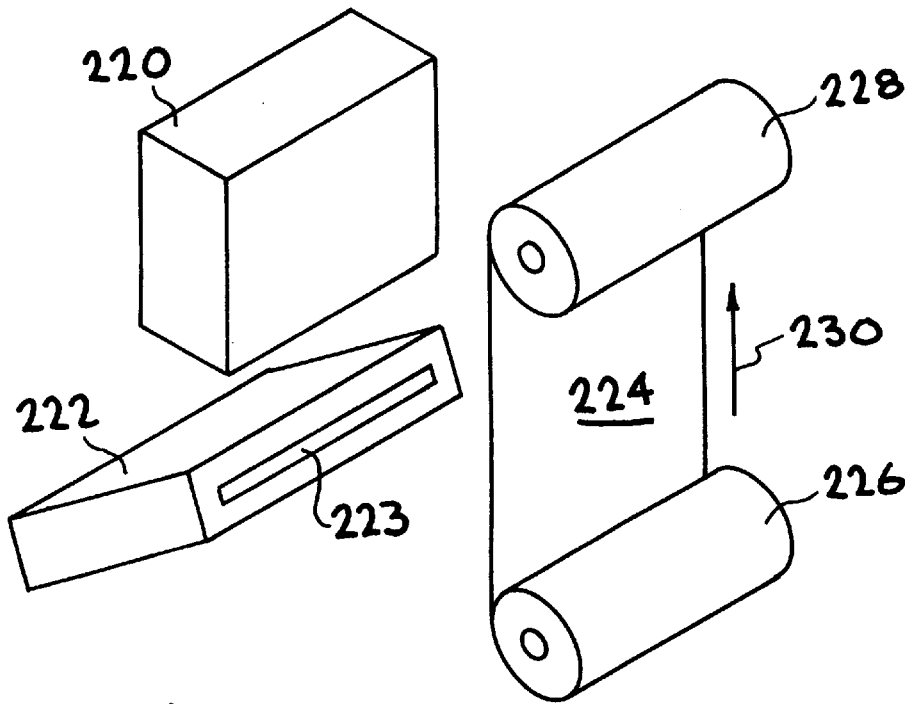
FIG. 12 shows a principal set up for coatings of dielectrics such as webs with a linear constricted plasma source; the metal comes from a metal source such as an evaporator or sputtering source.

FIG. 12 shows a web substrate 224 that is wound in the direction shown by the arrow 230 from a bottom roller 226 to a top roller 228 during processing. Facing the web substrate 224 is a sputtering source or evaporator 220 adjacent to a linear constricted plasma source 222 having a slit 223 facing the web substrate 224. The linear constricted plasma source 222 can be constructed, as space permits, from a constricted glow discharge source 220 such as shown in FIG. 11.

FIG. 13 shows a "Pencil-size Constricted Plasma Source." It is a novel design of the "constricted-plasma source" or "hollow-anode plasma source" characterized by its extremely small size (pencil size) and simple construction while maintaining the output of older versions.

The new features of the pencil source are made possible by
use of a metallic gas feed as a hollow cathode
integrated insulator body, in particular a low cost glass (Pyrex) or quartz housing
metallized insulator housing acting as an anode
small housing diameter and constriction size.

The device can be made from high temperature materials which are coated with noble metals such as gold, platinum and palladium. Such sources can use oxygen as the gas supply. Tungsten will not work with oxygen as it will oxidize, but will work with nitrogen.

The re-designed source allows operation down to very low gas pressures ($1 \times 10^{-5}$ Torr), thus making true MBE (molecular beam epitaxy) conditions of thin film growth possible. The most prominent applications is the growth of MBE gallium nitride. Other applications include the plasma-assisted deposition of metal oxide films for solar control, electrochromic devices ("smart windows"), packaging materials, etc.

The difference between this and the previous versions are that
the source can be made much cheaper (very simple, compact construction) than any other earlier version or comparable source.
due to its very small diameter, the source can be brought closer to the substrate than any other source without obstructing the flux of other reactive material such as gallium evaporated from a Knudsen cell. As a result, the density of activated species (atoms, ions, and excited molecules) is much higher, and the growth rate can be higher.
the pencil-size source can be used as a module to be assembled in large source structures such as a quasi-linear source. For instance, a linear array with about one "pencil source" per inch could be built to arbitrary length, allowing the processing (like metal oxide deposition) on large-area substrates such as window glass or webs (plastic film material).

FIG. 13 shows a pencil-sized plasma source 240 having a metallic gas feed hollow cathode 244 (one example having an outside diameter of 0.25 inches (6.35 mm) with an inside diameter of 0.1875 inches (4.76 mm) and being made of either stainless steel or titanium. The choice of material depends on whether oxygen or nitrogen is used as the gas input at inlet 242 to generate the plasma and avoid contamination of the substrate being used. A glass housing 246 with a closed end constriction 247 slips over the end of the hollow cathode 244 to create structural support as well as an insulating barrier between the hollow cathode 244 and a grounded coating or case 248 which has been applied (for example by sputtering) or slipped over (as a metallic tube) the end of the glass housing 246. The grounded coating or casing 248 is connected to ground 254. A water jacket 252 surrounds to the feed end of the pencil size source 240 to reduce operational temperatures. (In an example not shown, the construction of the pencil size source has eliminated the use of a water jacket such that cooling by radiation is sufficient to keep the structure below a distortion temperature.) A water inlet 256 feeds the water jacket 252 and a water outlet 258 provides an outlet for the circulating cooling water. While the end constriction 247 in the glass housing is pictured as a circulator opening, it may be a narrow slit as well.

In practice, implementation of the pencil size source 240 as shown in FIG. 13 requires that it be connected to a gas feed as shown in FIG. 14 with a ceramic disk with orifice 262 located in the gas feed at or near the location of a gas inlet flange or fitting 260. The purpose of the ceramic disk with orifice 262 is to prevent blow back (back burning) of the plasma which is generated in the hollow cathode arrangement described. The gas supply tube 264 is fitted to the gas inlet flange or fitting 260 to provide a gas source to the pencil size plasma source.

Figure 15:
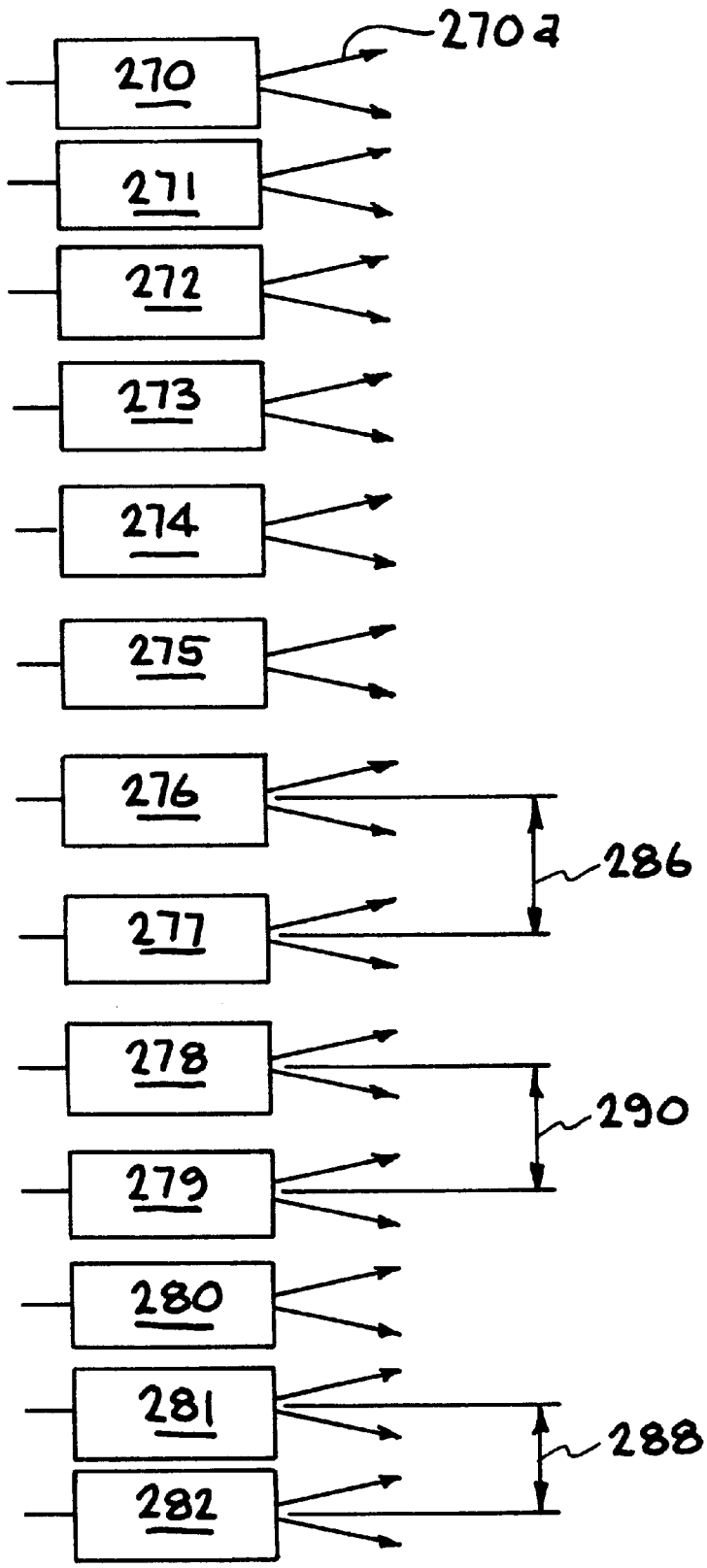
FIG. 15 shows a side view showing the spacing of a linear array of pencil sized plasma sources.

FIG. 15 shows an approximate variation in the spacing between adjacent cells when using a pencil size plasma source. The individual cells 270 through 282 in the linear array have their discharge orifices linearly aligned to provide a cone of plasma (for example 270a) which at a moderate distance from the source combine to create a continuous substantially uniform plasma density (flux) along the linear array. However, so that the array does not have to be overly long when tracking relative to a substrate, the spacing between cells (for example centering spacing 286, edge spacing 288, and middle radius spacing 290) vary according to data which are theoretically approximated by the assumption of an asymptotic function (the change in the magnitude of flux density is nearly negligible as the flux measurement approaches the center of the substrate and drops off severely at the edge). The idea is to provide uniform plasma density all the way to the edge of the substrate without having to extend the plasma source too much beyond or at all beyond the edge of the substrate at which the plasma is being directed.

The ideal spacing distance between adjacent cells is a continuously increasing and decreasing gradation, with wide spacing and small changes in spacing at the center of the substrate track and narrow spacing and large changes in spacing at the edge of the array—with a gradual decrease in spacing towards the edge of the substrate. Empirical measurements establish the exact spacing needed to achieve the desired plasma flux profile. In general the desired plasma flux profile is approximately uniform so that variation in film thickness across a substrate does not vary more than 2 to 5 percent of the total thickness from highest to lowest.

There may be instances where a non-uniform flux is desired. The ability to closely space the cells is easily achieved using the pencil size plasma source described above, while such close spacing would be difficult if the earlier discussed hollow plasma anode source with its large body construction were used.

Figure 16:
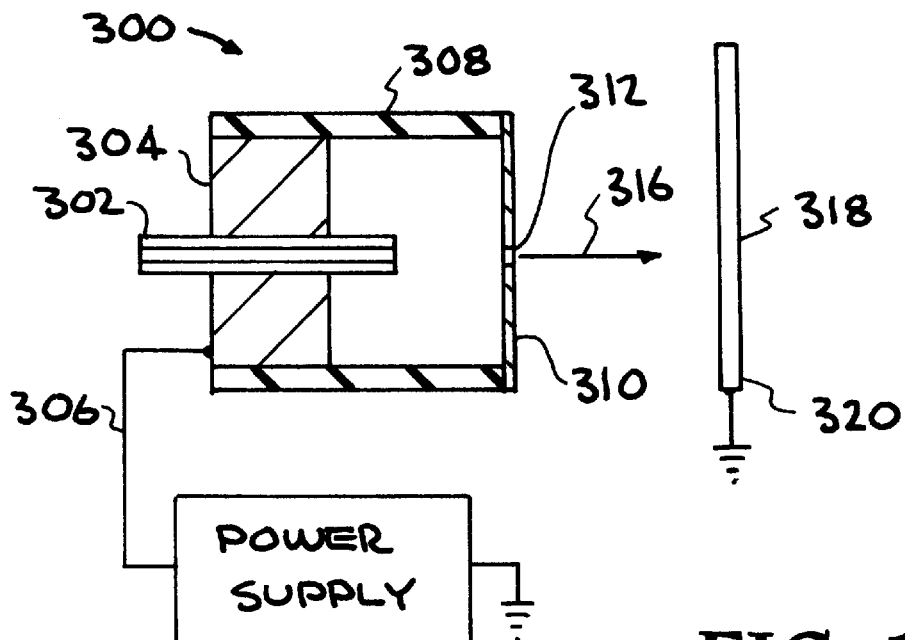
FIG. 16 shows a schematic cross sectional view of a constricted glow discharge cell with flat anode. The opening can be a hole or slit, and the end plate containing the discharge constriction can be made from an insulator material but is preferably a metal.

The precision of machining and assembly required to successfully construct a slit opening of a hollow anode source is difficult to achieve. A much better solution is to make use of another version of the constricted glow discharge (a version which is not a hollow-anode discharge). In this version, the slit can be made of a conductive material (i.e., no blocking ceramic plate is necessary), and the anode can be any close by electrode (like the chamber wall, the substrate, or an auxiliary electrode structure). In particular, the anode can be the chamber wall (ground) or a conductive substrate, thus the anode is not hollow in this configuration (FIG. 16).

The construction of the bare bones constricted glow discharge cell 300 which was described earlier, is shown in a simplified form in FIG. 16. A gas feed 302 extends through a cathode 304 to which power is supplied through a power supply cable 306. An insulator housing 308 separates the cathode 304 from a metal flat end plate 310 having a hole or slit (constriction) 312 therein. Plasma flow from the constriction 312 towards the anode 318 which is connected to ground 320 is shown by an arrow 316.

It was found experimentally that when using constricted glow discharge with a long slit, the plasma tended to be concentrated in one or several spots along the slit, so the plasma density is not homogeneous. Thus the re-configuration of a constricted glow discharge to operate acceptably with a slit is non-trivial. The wider and longer the slit, the higher will be the flow of gas. The stable regime of operation (i.e., plasma appearing substantially homogeneously along the slit) is related to the slit dimensions and flow and pressure settings: the larger the slit dimensions the higher must be the flow to maintain the pressure needed for the discharge inside the source. However, there is a contrary effect as well: a longer slit requires that the discharge inside the source operate at a lower pressure than with short slit or hole (otherwise the discharge will contract and the plasma will appear concentrated at only one or two locations of the slit). Low pressure operation implies larger discharge cell dimensions (which is consistent with a long slit). However, it was found that homogeneous plasma production can be achieved if the source is operated at sufficiently high voltage combined with a suitable gas flow which depends on the slit geometry (length and width). The dimensions of a slit are: length (for one discharge cell) 5 mm–100 mm; width 0.1–2 mm; preferred (tested) size: length: 20–50 mm, width 0.2 mm. For instance, one example of successful operation (i.e. homogeneous plasma production) was achieved for a 2 cm slit length (width=1.0 mm) at 1 kV supplied voltage and a flow rate of 100 sccm. In another experiment with 6.4 cm slit length (width=0.20 mm), homogeneous plasma production was observed for a voltage of 3 kV at a flow of 34 sccm.

The name "hollow-anode plasma source" is not appropriate anymore since the anode is flat. This discharge is called "constricted glow discharge" because the ionization effect is due to an electric double sheath (layer) forming at the constriction.

The transition from the cell of FIG. 11 to FIG. 16 represents not only a simplification in manufacturing the source but also results in a more intense plasma (the measured ion saturation current can be higher up to a factor 10, which can be partly attributed to the different opening (nozzle) shape).

A problem appears when the anode is too remote from the source body (say, more than 15 cm away: the discharge will not ignite (at least not with a reasonable voltage of 1–2 kV). A solution to the failure to ignite is to make the constriction from conductive material (a metal such as stainless steel) and connect the constriction to the anode potential (usually ground) via a high-Ohm "starting" resistor. The resistance must be larger than the external resistance of the discharge (which is about 10 kΩ) but small enough to allow the ignition of an auxiliary glow discharge between the cathode and the constriction. Resistor values between 50 kΩ and 1 MΩ have been successfully tested. The main constricted glow discharge starts each time when a starting resistor is used (FIG. 17) but does not start without it.

Figure 17:
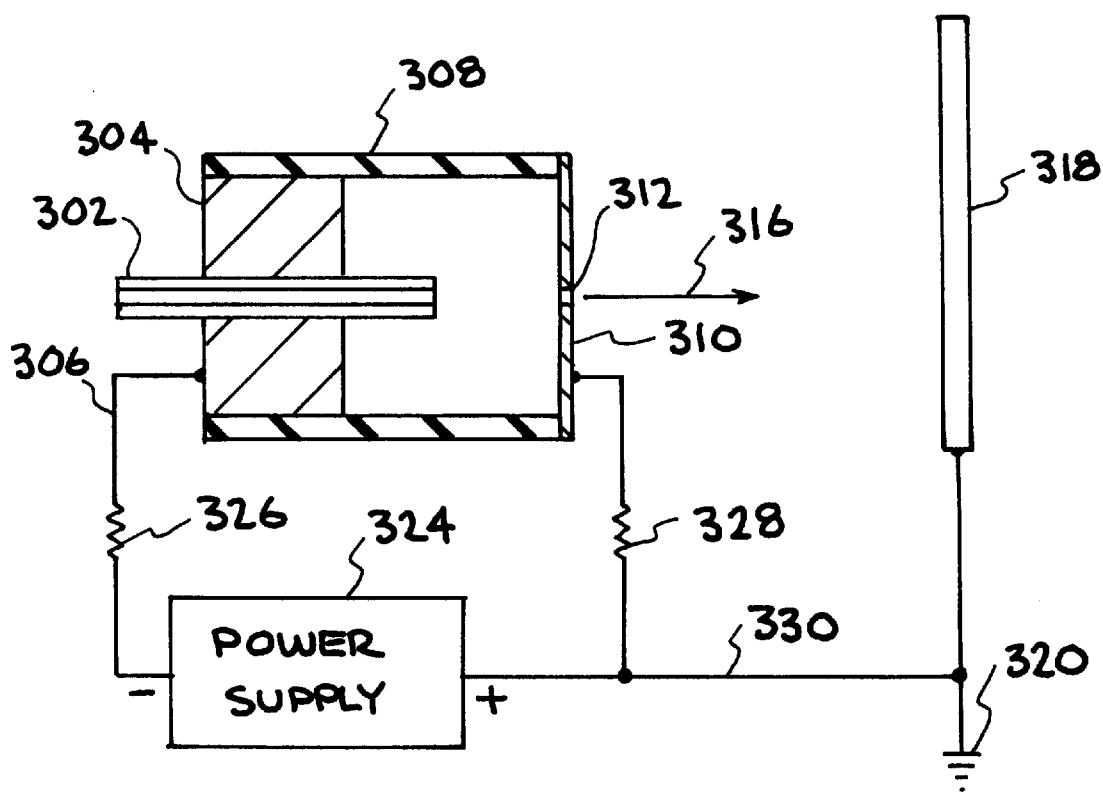
FIG. 17 shows the constricted glow discharge of FIG. 16 with an auxiliary glow discharge connection for improved reliability of plasma ignition.

FIG. 17 provides an enhanced initiation of the plasma of the constricted glow discharge with flat anode 300 as shown in FIG. 16 by providing a cell end plate resistor to ground 328 (having a value of 10 k-ohms to 2 M-ohms) to assist in initiating the plasma but having no effect once the plasma is initiated so that the plasma flow as shown by the arrow 316 is unimpeded towards anode 318. The power source 324 is connected through a power resistor 326 (having the external resistance of 10 k-ohms) to the cathode 304. Ground wire 330 connects the positive terminal of the power supply 324 to the ground 320.

In the constricted glow discharges of FIGS. 16 and 17, the substrate or a nearby chamber wall acts as the anode. This setup is not suitable for large, dielectric (i.e., non-conductive) substrates such as glass and plastic sheets (webs). Another setup, shown in FIG. 18 was successfully tested for this situation: a wide-slit auxiliary anode is closely placed downstream of the constriction. For example, the 6.4 cm slit source was equipped with an anode located 3 mm downstream, having a width of 6 mm. The dimensions of the anode are not very critical, in contrast to the constriction dimensions which are critical because they determine the pressure difference inside vs. outside the source, flow speed, and ionization processes.

Figure 18:
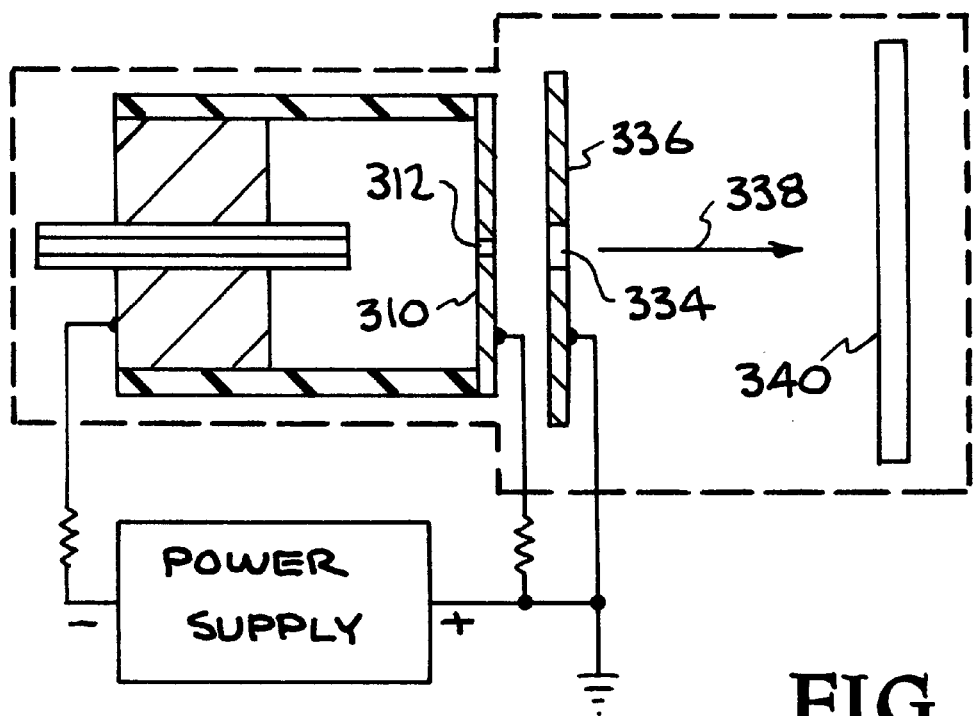
FIG. 18 shows a constricted plasma source with auxiliary anode for the treatment of dielectric substrates.

FIG. 18 shows the enhanced configuration of the constricted glow discharge with flat anode plasma source of FIG. 17 with a different anode configuration. In this configuration, an anode 336 has a hole or slot 334 matching the hole or slot 312 in the end of the constricted end plate 310 such that acceleration of the plasma ions takes place to create a plasma flow as shown by arrow 338 towards a substrate 340 which may be a dielectric or any conductive or non-conductive surface suitable for receiving a film coating.

For the deposition of oxide or nitride films, a flux of metal vapor (ions or neutrals) is necessary, i.e., the substrate is bombarded by both metal species and gas species (the latter from the constricted plasma source); the substrate is usually moved perpendicular to the slit to allow for large-area coatings for example as shown in FIG. 12.

Figure 19:
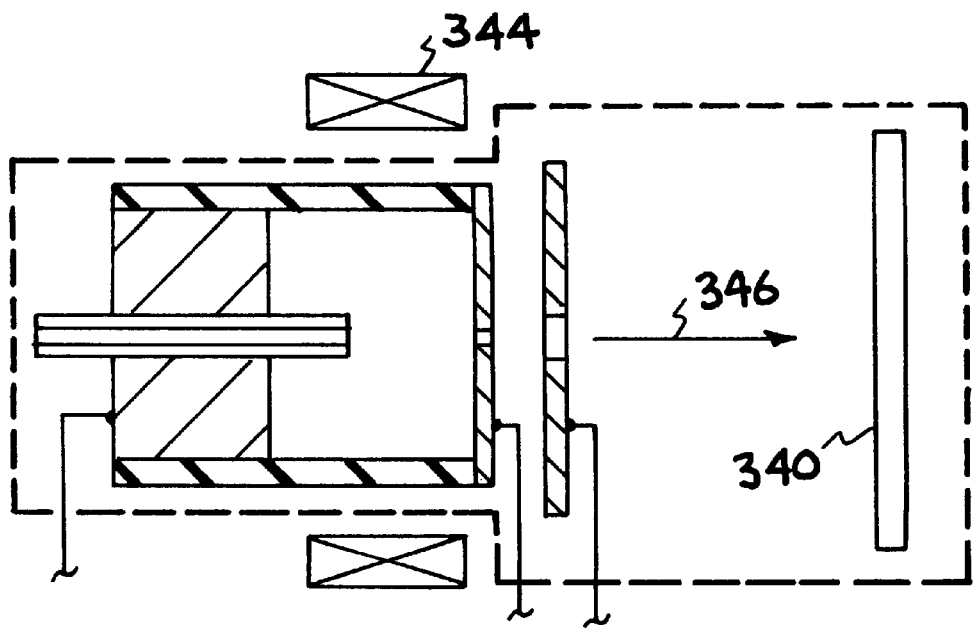
FIG. 19 shows a constricted plasma source with magnetic field coil.

The plasma output of the linear constricted plasma source can be considerably enhanced (by a factor of 2–3) by using an axial magnetic field as shown in FIG. 19. A field strength of 10 mT is sufficient to achieve a significant effect. The magnetic field can be obtained using a electromagnetic coil (as shown in FIG. 19) or can be formed by permanent magnets.

FIG. 19 shows the constricted glow discharge with flat anode cell arrangement as shown in FIG. 18, the components inside the dashed cloud are similar components while the power supply is not shown in FIG. 19. A magnet field coil 344 surrounds the chamber of the constricted flow discharge cell to enhance the discharge of plasma as shown by the plasma flow arrow 346 towards the substrate being processed 340.

All other features described apply as well: the linear constricted plasma source can be built as a dual-stage plasma source, a grounded housing can be built around the source the encapsulate all parts at high potential (cathode), the electrodes can be water or gas-cooled, depending on the power level and specific design (flange-mounted versus vacuum-mount). The cathode can have a hollow shape utilizing the hollow-cathode effect such as to allow stable operation in a wide range of pressures, included relatively low chamber pressures (for instance, operation in the $10^{-5}$ Torr range). The source can be built in such a way that it is ultrahigh vacuum (UHV) compatible by using suitable materials (avoid plastics, rubber O-rings, etc., for instance).

Figure 20:
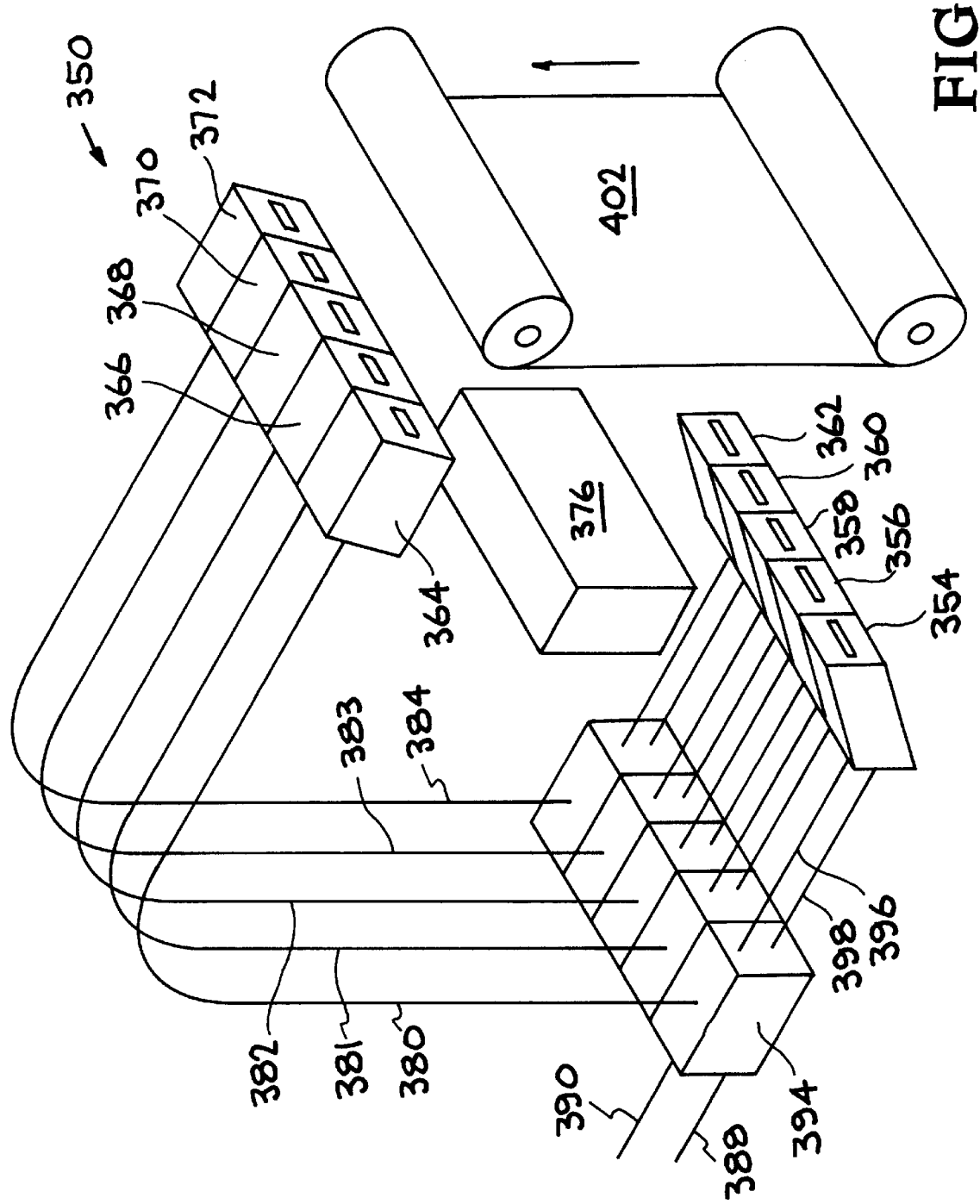
FIG. 20 shows an automatic feedback loop control system to control the film deposition along individual track of a plasma cell source compared to adjacent plasma cell sources for improved uniformity.

FIG. 20 shows a conceptualized arrangement of using a multiple cell quasi-linear or linear plasma source to improve the desired contour of the applied film as the feedback occurs from optical or other film quality sensors and is fed back through control circuitry to adjust the plasma flux to achieve a better match with a desired film profile.

FIG. 20 shows a web substrate 402 opposite a sputtering or evaporative source of a film material 376 which is adjacent to a linear array of individual plasma cells sources 354, 356, 358, 360, 362 which direct plasma a the web substrate 402. As the substrate moves in the direction of the arrow upwards, at set of linearly arranged film quality sensors 364, 366, 368, 370, 372 provide a feedback signal through wires 380, 381, 382, 383, 384 to a set of individual controllers, for example, controller for first cell 394 which controls the application of a global power source 388 and a global plasma cell gas feed 390 distribution to the first individual plasma cell 354 which acts on a first track on the moving substrate 402 by controlling the current as applied through a power feed for the first cell 398 and/or the gas feed for the first cell 396.

As described above, the plasma output profile can be spatially optimized (e.g., flat profile, or profile with more plasma from one end of source). The output can also be temporally optimized by controlling the power, gas flow rate on-line, and gas mixture preferably by a feedback control system.

For example, a metal vapor source and quasi-linear or linear CPS with oxygen are ignited. Their output is brought in contact with a substrate such as web (plastic sheet) or glass which is moved perpendicular to the main axis of the source at a controlled speed. Detectors measure the properties of the produced oxide film and provide their signals to a multi-channel control unit whose output signals are used to tune the cells of the CPS and, if the metal source is built of cells as well, also the metals vapor cells. Suppose film reflectance is measured and the reflectance detectors located on the edges of the substrate indicate signals greater than the detectors in the center, the control system determines lack of activated oxygen near the edges. As a response, the control system increases the power settings for the cells near the edges, causing higher ionization of the plasma and stronger oxidation of the film. This control feedback is almost instantaneous for the CPS, and has some delay for thermal evaporation sources. The feedback permits one to keep process parameters within tight tolerances and allows the homogeneous deposition of films such as optical films and diffusion barrier films.

Complementary to the detectors measuring the optical film properties, a set of detectors controlling the plasma parameters can be used. For instance, an optical detector, or a particle collector such as a Langmuir probe can be used to control the output of each discharge cell. These detectors provide valuable information about the operation of each source but give only indirect information about the film produced. Therefore, film measuring detectors are preferred.

Feedback systems are known to be used in coatings systems. For instance, U.S. Pat. No. 5,614,248, issued Mar. 25, 1997, entitled "Method for plasma-assisted reactive electron beam vaporization" describes a method in which the optical properties of the film are measured, and either the process gas flow or the parameters of a plasma between the electron beam evaporator and the substrate is tuned according to the measured signal. In contrast to the present invention, the parameter changes are global, rather than local. For instance, if the measured signal calls for an increase of the reactive gas flow, this flow increase will impact the whole deposition process and not at preferred locations.

A method of controlling the film contour on a substrate according to the invention may include the steps of: placing a linear array of plasma sources opposite a substrate which is moving with a movement relative to the linear array of plasma sources in a first direction; placing a linear array of film quality detectors to measure film quality on the substrate a first distance in a first direction from the linear array of plasma sources; and controlling the plasma quality of each plasma source along the linear array of plasma sources based on the film quality sensed along a track correlating to locations of the substrate as the substrate passes specific plasma source positions along the linear array.

The control modules can control the current supplied to each plasma source, or the gas flow rate to each plasma source, or both, to produce a desired deposited film profile. Each plasma source's processing track film quality is compared with an adjacent plasma source's processing track film quality to compare that plasma track's film profile with the desired film profile to adjust the current and/or gas flow rate to the plasma source.

Examples of the quasi-linear plasma source with feedback control are discussed below:

1. A commonly manufactured product is a sputtered transparent conductor such as indium tin oxide on polymer webs. Often the deposition process used is a process known by those skilled in the art as "fully reactive." A fully reactive process involves providing deposition from a metal sputtering target and bringing the deposited layer to a desired oxidation state by injecting an oxidizing gas such as oxygen into the sputtering chamber. Use of a secondary oxidizing gas plasma source adjacent to the transparent conductor sputtering target is a valuable improvement to the fully reactive process. Higher material deposition rates through use of increased sputtering power may be achieved while still maintaining the desired oxidation state of the layer. The increased reactivity of the oxidizing gas from the quasi-linear plasma source allows sufficient oxidation of the more rapidly arriving sputtered metal atoms, to achieve the desired oxidation state. Another advantage of the secondary plasma source involves lowering the impedance of the sputtering plasma which lessens the bombardment of the growing film by energetic neutral particles. This results in the growth of a more crystalline and therefore a more electrically conductive coating.

A requirement of nearly all transparent conductive coatings on polymer webs is a high level surface resistance uniformity across the width of the web. If the quasi-linear plasma source is used as the secondary plasma, the required uniformity can be maintained by locally tuning individual cells for oxidizing strength of the plasma output in response to continuous optical and electrical conductivity readings taken from the moving web during deposition. The tuning may be done by varying the power to the plasma cell, the overall gas flow and therefore the pressure in the cell, or the amount of oxidizing gas going to the cell by changing the gas mixture. The typical gas mixture would be a ratio of inert and oxidizing gas such as argon and oxygen controlled individually by two mass flow valves.

2. Another sputtering process which benefits from a locally tunable quasi-linear plasma source is the reactive sputter deposition of nitride films such as titanium nitride, zirconium nitride, or silicon nitride. When these materials are deposited in a polymer web coating process, there is always water vapor present as an outgassing product from the polymer substrate. Since titanium, zirconium, and silicon preferentially react with oxygen over nitrogen, it is not possible to deposit them as pure nitride compounds. In the resulting deposition of oxy-nitride films the ratio of nitrogen to oxygen in the compounds can be raised if the nitrogen gas injected into the process is made more reactive. The quasi-linear plasma source serves this purpose and when locally tuned by separately controlled individual cells through power or gas variations will allow deposition of a uniform compound across the width of polymer webs. The individual cells may be tuned on the basis of continuous spectral optical measurements made on the resultant coating. By simultaneous measurements of film reflectance and transmission the optical properties of the films may be calculated and the nitrogen:oxygen ratio subsequently determined. The optical properties of various ratios of nitrogen:oxygen compounds may be made known by empirical determination of known film optical properties or by optical modeling and the use of Effective Media Approximation calculation techniques.

Wide width evaporative deposition techniques are particularly benefited by the addition of (or use of) the locally tunable quasi-linear plasma source with control based continuous optical or electrical measurements made on the deposited layers. Evaporative deposition processes such as electron beam, resistively heated wire fed boat, resistively heated effusion boxes, or other evaporative sources known to those skilled in the art are desirable due to the high metal deposition rates possible from these types of sources. Attempts to run these types of sources reactively to produce oxides, nitrides or other compounds are generally not successful unless plasma assist is used. If reactive gases are injected into the evaporant vapor stream which have not been raised in energy state by some means, generally, the resulting deposited film will not reach a fully reacted, stoichiometric state. The locally tunable quasilinear plasma source can provide the necessary reactive gas excitation and as previously described, provide coating uniformity across the substrate by feedback control.

While the invention has been described with regards to specific embodiments, those skilled in the art will recognize that changes can be made in form and detail without departing from the spirit and scope of the invention.

What is claimed is:

1. A plasma source array comprising:
   a set of at least two plasma sources located opposite a substrate processing location, where each of said at least two plasma sources provides plasma processing to a corresponding plasma processing track produced as said substrate is moved relative to said plasma source;
   a set of at least two film quality detectors, each detector being located to measure a physical parameter of a film deposited in a corresponding plasma source's processing track;
   a set of at least two plasma source control modules, each one being matched with a corresponding plasma source of said at least two plasma sources and a corresponding film quality detector of said at least two film quality detectors, wherein each control module controls at least one of at least two external active elements needed to achieve and maintain a plasma from each of said set of at least two plasma sources based on information about film quality received from the corresponding film quality detector.

2. The plasma source array as in claim 1,
   wherein said set of at least two plasma sources is a set of at least three plasma sources.

3. The plasma source array as in claim 1,
   wherein each said film quality detector is an optical detector.

4. The plasma source array as in claim 1,
   wherein each said film quality detector is a detector of electrical qualities.

5. The plasma source array as in claim 1, further comprising a set of Langmuir probes to provide information about the plasma quality of each plasma source as the substrate is processed opposite each plasma source to indirectly measure a physical parameter of a deposited film.

6. The plasma source array as in claim 1,
   wherein said set of at least two plasma source control modules controls a current supplied to each plasma source.

7. The plasma source array as in claim 6,
   wherein each of said set of at least two plasma source control modules control said current in each plasma source to produce a desired film profile, where each plasma source's processing track film quality is compared with an adjacent plasma source's processing track film quality to compare said plasma track's film profile with said desired film profile to adjust said current in each plasma source.

8. The plasma source array as in claim 7,
   wherein said desired film profile is substantially planar.

9. The plasma source array as in claim 7,
   wherein said desired film profile is a prescribed non-planar contour.

10. The plasma source array as in claim 6,
    wherein said set of at least two plasma source control modules controls a flow rate of gas supplied to each plasma source.

11. The plasma source array as in claim 1,
    wherein said set of at least two plasma source control modules controls a flow rate of gas supplied to each plasma source.

12. The plasma source array as in claim 11, wherein said set of at least two plasma source control modules controls said flow rate of gas supplied to each plasma source to produce a desired film profile, where each plasma source's processing track film quality is compared with an adjacent plasma source's processing track film quality to compare said plasma track's film profile with said desired film profile to adjust said flow rate of gas supplied to each plasma source.'

13. The plasma source array as in claim 12, wherein said desired film profile is substantially planar.

14. The plasma source array as in claim 12, wherein said desired film profile is a prescribed non-planar contour.

15. The plasma source array as in claim 12, wherein each of said set of at least two plasma source control modules control said current in each plasma source to produce a desired film profile, where each plasma source's processing track film quality is compared with an adjacent plasma source's processing track film quality to compare said plasma track's film profile with said desired film profile to adjust said current in each plasma source.

16. The plasma source array as in claim 15, wherein said desired film profile is substantially planar.

17. The plasma source array as in claim 15, wherein said desired film profile is a prescribed non-planar contour.

18. The plasma source array as in claim 1, wherein said set of at least two plasma source control modules control the ratio of at least two gases of a gas mixture supplied to each plasma source.

19. The plasma source array as in claim 1, wherein said set of at least two plasma sources forms a part of a vacuum deposition sputtering system.

20. The plasma source array as in claim 1, wherein said set of at least two plasma sources forms a part of a vacuum deposition evaporation system.

21. A method of controlling the film contour on a substrate comprising the steps of:

placing a linear array of plasma sources opposite a substrate which is moving with a movement relative to said linear array of plasma sources in a first direction;

placing a linear array of film quality detectors to measure film quality on said substrate a first distance in a first direction from said linear array of plasma sources;

controlling the plasma quality of each plasma source along said linear array of plasma sources based on the film quality sensed along a track correlating to locations of said substrate as said substrate passes specific plasma source positions along said linear array.

\* \* \* \* \*